(12) United States Patent
Kim et al.

(10) Patent No.: US 11,977,771 B2
(45) Date of Patent: May 7, 2024

(54) MEMORY DEVICE AND MEMORY SYSTEM

(71) Applicant: SK hynix Inc., Gyeonggi-do (KR)

(72) Inventors: Dae Sung Kim, Gyeonggi-do (KR); Sung Ho Ahn, Gyeonggi-do (KR); Sin Ho Yang, Gyeonggi-do (KR); Jae Hyeong Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 426 days.

(21) Appl. No.: 17/324,579

(22) Filed: May 19, 2021

(65) Prior Publication Data

US 2022/0164143 A1 May 26, 2022

(30) Foreign Application Priority Data

Nov. 25, 2020 (KR) .......... 10-2020-0159958

(51) Int. Cl.
*G06F 16/00* (2019.01)
*G06F 3/06* (2006.01)
*G06F 11/10* (2006.01)
*G06F 16/174* (2019.01)
*G11C 7/10* (2006.01)
(Continued)

(52) U.S. Cl.
CPC .......... *G06F 3/0659* (2013.01); *G06F 3/0608* (2013.01); *G06F 3/0673* (2013.01); *G06F 11/1012* (2013.01); *G06F 11/1072* (2013.01); *G06F 16/1744* (2019.01); *G11C 7/1006* (2013.01); *G11C 16/26* (2013.01); *H03M 7/40* (2013.01); *H03M 7/4081* (2013.01); *H03M 7/6041* (2013.01); *H03M 7/6094* (2013.01); *G06F 2212/401* (2013.01); *G11C 11/56* (2013.01); *G11C 16/0483* (2013.01); *G11C 2207/102* (2013.01)

(58) Field of Classification Search
CPC .. G06F 3/0659; G06F 16/1744; G06F 3/0608; G06F 3/0673; G06F 11/1012; G06F 11/1072; G06F 2212/401; G11C 7/1006; G11C 16/26; G11C 11/56; G11C 16/0483; G11C 2207/102; H03M 7/40; H03M 7/4081; H03M 7/6041; H03M 7/6094

See application file for complete search history.

(56) References Cited

U.S. PATENT DOCUMENTS 9,329,928 B2  5/2016 Fitzpatrick et al.
2016/0085615 A1* 3/2016 Nekuii .............. H03M 13/3723
                                                    714/776

(Continued)

*Primary Examiner* — Bruce M Moser
(74) *Attorney, Agent, or Firm* — IP&T GROUP LLP

(57) ABSTRACT

A memory device includes: a plurality of memory cells; soft read logic configured to generate soft data by reading data from the plurality of memory cells in response to a soft read command from a controller, the soft data including at least a major symbol and at least a minor symbol; a compressor configured to generate compressed data by: encoding, into a code alphabet having a second length, a major source alphabet including repetitions of the major symbol by a first length among a plurality of source alphabets included in the soft data, and encoding, into a code alphabet having a longer length than the second length, a minor source alphabet including repetitions of the major symbol by a shorter length than the first length and ending with one minor symbol; and an interface configured to provide the compressed data to the controller.

22 Claims, 16 Drawing Sheets

(51) Int. Cl.
  *G11C 16/26* (2006.01)
  *H03M 7/30* (2006.01)
  *H03M 7/40* (2006.01)
  *G11C 11/56* (2006.01)
  *G11C 16/04* (2006.01)

(56) References Cited

U.S. PATENT DOCUMENTS

2020/0104209 A1* 4/2020 El Gamal .............. G11C 29/52
2021/0096948 A1* 4/2021 Gopalakrishnan ..... G11C 29/74
2022/0129163 A1* 4/2022 Sravan ................... G06F 3/061

* cited by examiner

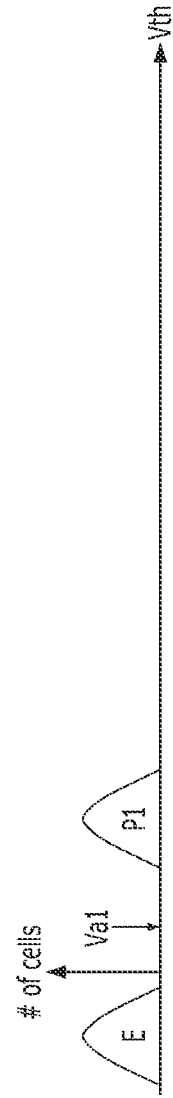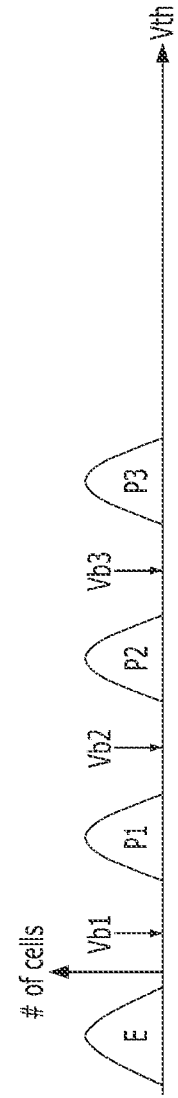

| Source alphabet | Code alphabet |
|---|---|
| 1 | 1,0,0,0,0 |
| 01 | 1,0,0,0,1 |
| 001 | 1,0,0,1,0 |
| 0001 | 1,0,0,1,1 |
| 00001 | 1,0,1,0,0 |
| 000001 | 1,0,1,0,1 |
| 0000001 | 1,0,1,1,0 |
| 00000001 | 1,0,1,1,1 |
| 000000001 | 1,1,0,0,0 |
| 0000000001 | 1,1,0,0,1 |
| 00000000001 | 1,1,0,1,0 |
| 000000000001 | 1,1,0,1,1 |
| 0000000000001 | 1,1,1,0,0 |
| 00000000000001 | 1,1,1,0,1 |
| 000000000000001 | 1,1,1,1,0 |
| 0000000000000001 | 1,1,1,1,1 |
| 0000000000000000 | 0 |

FIG. 6

Soft data: 00000 00000 00000 00010 00000 00000 00000 00001 00001 00001 : 50bits

Compressed data : 0 10010 0 10011 10011 10011 : 22bits

700

| Code alphabet | Source alphabet |
|---|---|
| 1,0,0,0,0 | 1 |
| 1,0,0,0,1 | 01 |
| 1,0,0,1,0 | 001 |
| 1,0,0,1,1 | 0001 |
| 1,0,1,0,0 | 00001 |
| 1,0,1,0,1 | 000001 |
| 1,0,1,1,0 | 0000001 |
| 1,0,1,1,1 | 00000001 |
| 1,1,0,0,0 | 000000001 |
| 1,1,0,0,1 | 0000000001 |
| 1,1,0,1,0 | 00000000001 |
| 1,1,0,1,1 | 000000000001 |
| 1,1,1,0,0 | 0000000000001 |
| 1,1,1,0,1 | 00000000000001 |
| 1,1,1,1,0 | 000000000000001 |
| 1,1,1,1,1 | 0000000000000001 |
| 0 | 0000000000000000 |

Compressed data: 0 1 0 0 1 0 0 1 0 0 1 1 1 0 0 1 1 1 0 0 1 1
                          001      00001    00001    00001
        00000 00000 00000 0    00000 00000 00000 0
Decompressed data:    00000 00000 00000 0 001 0 00000 00000 00000 00001 00001 00001

|  | Soft data | End data |
| --- | --- | --- |
| Soft data +End bit: | 00000 00000 00000 00010 00000 00000 00000 00001 00001 00000 | 1 : 51bits |
| Compressed data : | 0  10010  0  10011 10011 10101 | : 22bits |

| Source alphabet | Code alphabet |
|---|---|
| 1 | 1,0,0,0 |
| 01 | 1,0,0,1 |
| 001 | 1,0,1,0 |
| 0001 | 1,0,1,1 |
| 00001 | 1,1,0,0 |
| 000001 | 1,1,0,1 |
| 0000001 | 1,1,1,0 |
| 00000001 | 1,1,1,1 |
| 00000000 | 0 |

| Source alphabet | Code alphabet |
|---|---|
| 0 | 1,0,0,0,0 |
| 10 | 1,0,0,0,1 |
| 110 | 1,0,0,1,0 |
| 1110 | 1,0,0,1,1 |
| 11110 | 1,0,1,0,0 |
| 111110 | 1,0,1,0,1 |
| 1111110 | 1,0,1,1,0 |
| 11111110 | 1,0,1,1,1 |
| 111111110 | 1,1,0,0,0 |
| 1111111110 | 1,1,0,0,1 |
| 11111111110 | 1,1,0,1,0 |
| 111111111110 | 1,1,0,1,1 |
| 1111111111110 | 1,1,1,0,0 |
| 11111111111110 | 1,1,1,0,1 |
| 111111111111110 | 1,1,1,1,0 |
| 1111111111111110 | 1,1,1,1,1 |
| 1111111111111111 | 0 |

FIG. 11C

| Source alphabet | Code alphabet |
|---|---|
| 0 | 1,0,0,0 |
| 10 | 1,0,0,1 |
| 110 | 1,0,1,0 |
| 1110 | 1,0,1,1 |
| 11110 | 1,1,0,0 |
| 111110 | 1,1,0,1 |
| 1111110 | 1,1,1,0 |
| 11111110 | 1,1,1,1 |
| 11111111 | 0 |

| Source alphabet | Code alphabet |
|---|---|
| 0 | 1,0,0,0,0 |
| 1 | 1,0,0,0,1 |
| 2 | 1,0,0,1,0 |
| 30 | 1,0,0,1,1 |
| 31 | 1,0,1,0,0 |
| 32 | 1,0,1,0,1 |
| 330 | 1,0,1,1,0 |
| 331 | 1,0,1,1,1 |
| 332 | 1,1,0,0,0 |
| 3330 | 1,1,0,0,1 |
| 3331 | 1,1,0,1,0 |
| 3332 | 1,1,0,1,1 |
| 33330 | 1,1,1,0,0 |
| 33331 | 1,1,1,0,1 |
| 33332 | 1,1,1,1,0 |
| 33333 | 0 |

1200

MEMORY DEVICE AND MEMORY SYSTEM

CROSS-REFERENCE TO RELATED APPLICATION

This application claims priority under 35 U.S.C. § 119 to Korean Patent Application No. 10-2020-0159958 filed on Nov. 25, 2020, which is incorporated herein by reference in its entirety.

BACKGROUND

1. Field

Exemplary embodiments relate to a memory device and a memory system including the same.

2. Discussion of the Related Art

A system semiconductor device serves to perform an information processing operation such as data computation and control, and a memory semiconductor device serves to store data. The memory semiconductor device may include a volatile memory device used to temporarily store data and a nonvolatile memory device used to permanently store data.

Unlike a hard disk, a data storage device using a nonvolatile semiconductor memory device is advantageous in that it has excellent stability and durability because it has no mechanical driving parts (e.g., a mechanical arm), and has high data access speed and low power consumption. In the context of a memory system having such advantages, an exemplary data storage device includes a USB (Universal Serial Bus) memory device, a memory card having various interfaces, a solid state drive (SSD), or the like.

SUMMARY

Various embodiments are directed to a memory system which can avoid the complexity and reduction in performance of the memory system, and improve the use efficiency of a memory device, thereby stably protecting and rapidly processing data stored in the memory device, a data processing system and an operating operation thereof.

Also, various embodiments are directed to a method and apparatus which can compress soft data using variable length encoding, thereby improving data transfer efficiency between a memory device and a controller, and reducing power consumption in an interface between the memory device and the controller.

The technical problems of the present disclosure are not limited to those mentioned above, and the other technical problems which are not mentioned can be clearly understood by the person skilled in the art from the following descriptions.

In accordance with an embodiment, a memory device includes: a plurality of memory cells; soft read logic configured to generate soft data by reading data from the plurality of memory cells in response to a soft read command from a controller, the soft data including at least a major symbol and at least a minor symbol; a compressor configured to generate compressed data by: encoding, into a code alphabet having a second length, a major source alphabet including repetitions of the major symbol by a first length among a plurality of source alphabets included in the soft data, and encoding, into a code alphabet having a longer length than the second length, a minor source alphabet including repetitions of the major symbol by a shorter length than the first length and ending with one minor symbol; and an interface configured to provide the compressed data to the controller.

The compression unit may generate the compressed data based on a selected one among one or more compression tables, each indicating relationships between the major and minor source alphabets and the corresponding code alphabets.

The memory device may further include a compression method selector configured to store the compression tables and selecting one among the compression tables according to a value of the major symbol, a value of the minor symbol and a value of the first length.

The compression method selector may select the compression table having a particular value of the first length based on error rate information, and wherein the error rate information includes at least any one of length information of previously compressed data and information on a number of error bits detected from data decompressed from the previously compressed data.

The compression method selector may select the compression table having the particular value of the first length further based on a soft read voltage, through which the data is read from the memory cells.

The compression method selector may select the compression table having a particular value of the major symbol and a particular value of the minor symbol based on a number of the major symbol and the minor symbol and the value of the major symbol and the minor symbol included in the soft data.

The soft data may be multi-bit soft data including multi-bit reliability information per memory cell, wherein the compressor is further configured to drive the soft data into even-bit data and odd-bit data, wherein the compression method selector selects the compression table for each of the even-bit data and the odd-bit data further based on error rate information of each of the even-bit data and the odd-bit data, wherein the compressor generates compressed data for each of the even-bit data and the odd-bit data, and wherein the error rate information for each of the even-bit data and the odd-bit data includes at least any one of length information of previously compressed data for corresponding one of the even-bit data and the odd-bit data, and information on a number of error bits detected from data decompressed from the previously compressed data.

The soft data may be non-binary soft data including non-binary reliability information per memory cell, wherein the compression method selector selects the compression table further based on error rate information and a number of symbols for indicating the non-binary reliability information, and wherein the error rate information includes at least any one of length information of previously compressed data and information on a number of error bits detected from data decompressed from the previously compressed data.

The code alphabet having the second length may be not a prefix of the code alphabet having the longer length than the second length, and wherein the code alphabets encoded from different minor source alphabets have different values.

The code alphabet having the second length may be '0', and wherein the first digit of the code alphabet having the longer length than the second length may be '1'.

The compressor may generate the compressed data based on a selected one among one or more compression tables, each indicating relationships between the major and minor source alphabets and the corresponding code alphabets, wherein, in each of the compression tables, a total number of the minor source alphabets depends on the first length, wherein a length of the code alphabet having a longer length than the second length depends on the total number of the minor source alphabets.

The major symbol may be the most likely to occur in the soft data, and wherein the minor symbol is a symbol other than the major symbol.

The major symbol may be a symbol, of which reliability is stronger than the minor symbol.

The compression unit may generate the compressed data further by: adding end data to an end of the soft data, and encoding, as the minor source alphabet, a chunk configured by the end data and remaining symbols, which are successive to the end data and do not belong to the major source alphabet or the minor source alphabet in the soft data.

The end data may be the minor symbol.

The compression unit may detect the major source alphabets and the minor source alphabets from the soft data by instantaneously checking the plurality of symbols within the soft data.

In accordance with an embodiment, a memory system includes: a memory device; and a controller configured to provide a soft read command and error rate information to the memory device, wherein the memory device includes logic configured to generate soft data including at least a major symbol and at least a minor symbol in response to the soft read command, a selector configured to select, based on the soft read command and the error rate information, any one of a plurality of compression tables each indicating relationships between source alphabets and corresponding code alphabets, a compressor configured to generate compressed data by encoding the source alphabets detected from the soft data into the corresponding code alphabets according to the selected compression table, and provide the compressed data to the controller, wherein a source alphabet is not a prefix of another source alphabet within each of the plurality of compression tables, wherein a major source alphabet is the most likely to occur and has the longest length among the source alphabets within each of the plurality of compression tables, and wherein the code alphabet corresponding to the major source alphabet has the smallest length among the code alphabets within each of the plurality of compression tables.

The controller may generate decompressed data by decompressing the compressed data according to a decompression table corresponding to the selected compression table, and perform soft decision decoding the decompressed data.

The memory device may generate the compressed data further by: adding end data to an end of the soft data, and encoding, as one of the source alphabets detected from the soft data, a chunk configured by the end data and remaining data, which are successive to the end data and do not belong to the source alphabets in the soft data.

The controller may generate decompressed data by decompressing the compressed data, and perform soft decision decoding on the decompressed data when the decompressed data has a predetermined length and has the end data at an end thereof, and wherein the predetermined length is a sum of a length of the soft data and a length of the end data.

The controller may be further configured to request, when the decompressed data does not have the predetermined length or does not have the end data at the end thereof, the compressed data from the memory device.

In accordance with an embodiment, a data system includes: a compressor configured to compress an original sequence including at least first and second symbols by referring to a table; and a decompressor configured to recover the original sequence from the compressed sequence by referring to the table, wherein the table includes original alphabets of different values and corresponding compressed alphabets of different values, the alphabets being defined according to a Huffman coding scheme, wherein each of the original alphabets of various lengths ends with one between the first and second symbols and a remaining part of the original alphabet is configured by repetitions of the first symbol, and wherein the compressed alphabet corresponding to the original alphabet ending with the first symbol is shorter than other compressed alphabets having the same length.

In accordance with the present embodiments, the method and apparatus can compress soft data using compressed data (codes), which express a plurality of individual symbols (or symbols) according to the occurrence probabilities of the individual symbols by applying Huffman codes, thereby improving soft data transfer efficiency between a memory device and a controller, and reducing power consumption in an interface between the memory device and the controller.

The effects of the present disclosure are not limited to those mentioned above, and the other effects which are not mentioned can be clearly understood by the person skilled in the art from the following descriptions.

BRIEF DESCRIPTION OF THE DRAWINGS

FIGS. 3A to 3D are graphs for describing threshold voltage distributions of memory cells.

FIG. 5 illustrates a first compression table in accordance with the embodiment.

FIG. 6 illustrates soft data and compressed data.

FIGS. 11A to 11C are diagrams for describing a second soft data generation method and a second-type compression table.

FIGS. 12A and 12B are diagrams for describing a third soft data generation method and a third-type compression table.

DETAILED DESCRIPTION

Hereafter, exemplary embodiments will be described in detail with reference to the accompanying drawings. It should be noted that the following descriptions will be focused on portions required for understanding an operation in accordance with an embodiment, and descriptions of the other portions will be ruled out in order not to unnecessarily obscure subject matters of the present disclosure.

Hereafter, exemplary embodiments will be described in more detail with reference to the accompanying drawings.

Figure 1:
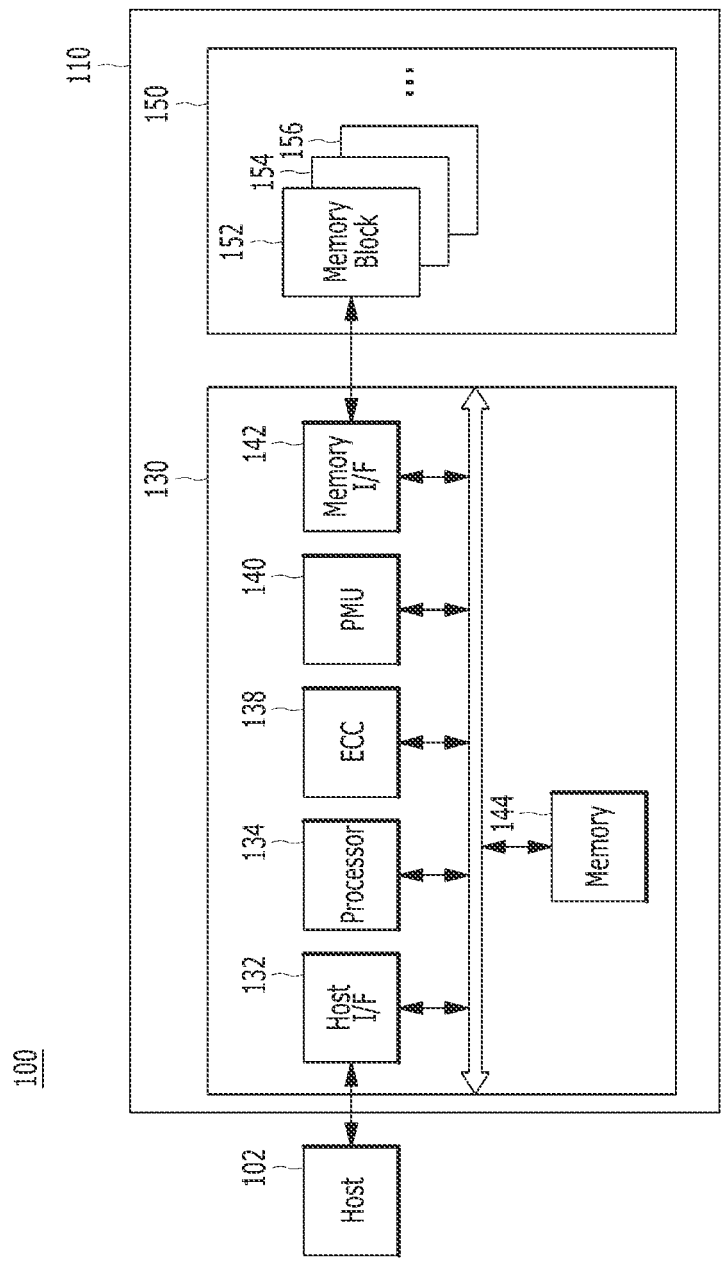
FIG. 1 illustrates a data processing system in accordance with an embodiment.

FIG. 1 illustrates a data processing system in accordance with an embodiment.

Referring to FIG. 1, a data processing system 100 includes a host 102 and a memory system 110. For example, the host 102 and the memory system 110 may be coupled through a data transfer unit such as a data bus or host cable, and transmit/receive data to/from each other.

The host 102 may include any of various portable electronic devices such as a mobile phone, MP3 player and laptop computer, or any of various non-portable electronic devices such as a desktop computer, a game machine, a television (TV), and a projector.

The host 102 may include at least one operating system (OS), which may manage and control overall functions and operations of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user.

For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The controller 130 included in the memory system 110, may control the memory device 150 in response to a request from the host 102. For example, the controller 130 may provide data read from the memory device 150 to the host 102, and store data provided from the host 102 into the memory device 150. For this operation, the controller 130 may control read, program and erase operations of the memory device 150.

In an embodiment, the controller 130 may include a host interface (I/F) 132, a processor 134, an error correction code (ECC) component 138, a Power Management Unit (PMU) 140, a memory I/F 142, and a memory 144.

In an embodiment, the controller 130 may include a host Interface I/F 132, a processor 134, an Error Correction Circuitry (ECC) 138, a Power Management Unit (PMU) 140, a memory I/F 142 and a memory 144. The components included in the controller 130 described with reference to FIG. 1 may be changed depending on an implementation and operation performance of the memory system 110. Non-limiting examples of the memory system 110 may include a solid state drive (SSD), a multi-media card (MMC), a secure digital (SD) card, a universal serial bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the like. The components included in the controller 130 may be added or removed depending on an implementation of the memory system 110. The host 102 and the memory system 110 may each include a controller or interface for transmitting/receiving signals, data and the like in response to promised standards. For example, the host I/F 132 within the memory system 110 may include a device which can transmit a signal, data or the like to the host 102, or receive a signal, data or the like from the host 102.

The host I/F 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE). The host I/F 132 may be driven through firmware referred to as a host interface layer (HIL) in order to exchange data with the host.

Integrated Drive Electronics (IDE) or Advanced Technology Attachment (ATA) which is one of the standards for transmitting/receiving data may support a data transmitting/receiving process between the host 102 and the memory system 110 by using a cable in which 40 lines are coupled in parallel. When a plurality of memory systems 110 are coupled to one host 102, the plurality of memory systems 110 may each be classified into a master or slave depending on a dip switch or location to which the corresponding memory system 110 is coupled. The memory system 110 set to the master may be used as a main memory device. IDE (ATA) has developed into Fast-ATA, ATAPI, EIDE (Enhanced IDE) or the like.

Serial Advanced Technology Attachment (SATA) is a serial data transmitting/receiving method which has compatibility with various ATA standards based on a parallel data transmitting/receiving method, which are connection standards of IDE devices, and can reduce the number of connection lines from 40 parallel signal lines to 6 serial signal lines. Since SATA has higher data transmitting/receiving speed and transmits/receives data by consuming less resources within the host 102 than IDE, SATA has been widely used. SATA can connect a maximum of 30 external devices to one transmitting/receiving device included in the host 102. Furthermore, since SATA supports a hot plugging function through which an external device can be detached/attached even while data communication is performed, SATA may connect or separate the memory system 110 as an additional device, with power supplied to the host 102, like a Universal Serial Bus (USB). For example, in the case of a device with an eSATA port, the memory system 110 may be detached from/attached to the host 102 like an external hard disk drive.

Small Computer System Interface (SCSI) refers to a serial connection method which is used to connect a peripheral device such as a computer or server, and has higher transmission speed than other interfaces such as IDE and SATA. In SCSI, the host 102 and a plurality of peripheral devices (for example, the memory systems 110) may be connected in series, but a data transmitting/receiving method between the host 102 and each of the peripheral devices may be implemented as a parallel data transmitting/receiving method. In SCSI, a device such as the memory system 110 may be easily connected to/separated from the host 102. SATA can support the connection of 15 external devices to one transmitting/receiving device included in the host 102.

Serial Attached SCSI (SAS) may be understood as a serial data transmitting/receiving version of SCSI. According to SAS, the host 102 and the plurality of peripheral devices may be connected in series, and data may be transmitted/received between the host 102 and the peripheral devices through a serial data transmitting/receiving method. According to SAS, the host 102 and the peripheral devices may be connected through a serial cable in place of a wide parallel cable including a large number of connection lines. Thus, equipment management may be easily conducted, and reliability and performance may be improved. SAS can connect a maximum of 8 external devices to one transmitting/receiving device included in the host 102.

Non-Volatile Memory express (NVMe) may refer to a protocol based on a Peripheral Component Interconnect express (PCIe) which can improve the performance of the host 102 such as a server or computing device having the nonvolatile memory system 110 mounted therein, and raise design flexibility. Here, PCIe may have a bandwidth of several hundreds of MB or more (for example, 250 MB/s, 500 MB/s, 984.6250 MB/s, 1389 MB/s or the like) per second per wiring line through a plurality of pins (for example, 18, 32, 49 or 82 pins) and one or more wiring lines (for examples, ×1, ×4, ×8, ×16 and the like), by using a slot or specific cable for connecting the host 102 such as a computing device to the memory system 110 such as a peripheral device connected to the computing device. Through this configuration, PCIe may implement a bandwidth of several tens to hundreds of Gbit per second. NVMe may support the speed of the nonvolatile memory system 110 such as an SSD which operates at higher speed than a hard disk drive.

In an embodiment, the host 102 and the memory system 110 may be connected through USB. The USB may include a hot plug-type plug and plug serial interface which has excellent expandability to guarantee economic standard connection for a peripheral device such as a keyboard, mouse, joystick, printer, scanner, storage device, modem or video conference camera. A plurality of peripheral devices such as the memory systems 110 may be connected to one transmitting/receiving device included in the host 102.

Referring to FIG. 1, the ECC 138 within the controller 130 may correct an error bit of data processed by the memory device 150. In an embodiment, the ECC unit 138 may include an ECC encoder and an ECC decoder. The ECC encoder may generate data with a parity bit by performing error correction encoding on data to be programmed into the memory device 150, and the data with the parity bit may be stored in the memory device 150. When the ECC decoder reads data stored in the memory device 150, the ECC 138 may perform error correction decoding on the data read from the memory device 150, determine whether the error correction decoding has been successfully performed, output an indication signal, for example, an error correction success/fail signal according to the determination result, and correct an error bit of the read data by using a parity bit generated during an ECC encoding process. When the number of error bits exceeds a correctable error bit limit, the ECC 138 cannot correct the error bits, and output the error correction fail signal corresponding to the situation in which the error bits cannot be corrected.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to any specific structure. The ECC component 138 may include all circuits, modules, systems or devices for error correction.

For example, the ECC decoder may perform hard decision decoding or soft decision decoding on data transferred from the memory device 150. The hard decision decoding may be understood as one of two methods obtained by roughly dividing error correction. The hard decision decoding may include an operation of reading digital data of '0' or '1' from a nonvolatile memory cell within the memory device 150, and correcting an error of the read data. Since the hard decision decoding handles binary logic signals, a circuit or algorithm may be simply designed, and processing speed may be high.

The soft decision decoding distinguished from the hard decision decoding may include an operation of correcting an error based on values of 2 or more, which are obtained by quantizing the threshold values of the nonvolatile memory cells within the memory device 150. For example, the quantized values may include multi-bit data, approximate values or analog values. The controller 130 may receive the quantized values of 2 or more from the plurality of nonvolatile memory cells within the memory device 150, and then perform decoding based on plural pieces of information which are generated by characterizing the quantized values through a combination of information such as conditional probability and likelihood.

In an embodiment, the ECC decoder may use a low-Density Parity-Check and Generator Matrix (LDPC-GM) code among methods for the soft decision decoding. The LDPC code uses an algorithm which does not simply read the value of data in the memory device 150 as 1 or 0 or does not use the hard decision decoding, but can read the value of the data as several bits depending on reliability, and repeatedly improve the reliability information through a message exchange method, thereby deciding a final value of 1 or 0. For example, the decoding algorithm using the LDPC code may be understood as probabilistic decoding, and determine a value stored in a nonvolatile memory cell based on probabilistic information, compared to the hard decision decoding which encodes a value, outputted from a nonvolatile memory cell, into 0 or 1 for bit flipping that may occur in the memory device 150. Therefore, the decoding algorithm using the LDPC code can raise restoration possibility, and improve the reliability and stability of corrected information. The LDPC-GM code may have a scheme in which internal LDGM codes can be concatenated in series to high-speed LDPC codes.

In an embodiment, the ECC decoder may use Low-Density Parity-Check Conventional Codes (LDPC-CCs) among the methods for the soft decision decoding. The LDPC-CCs may have a scheme that uses linear time encoding and pipe line decoding based on a variable block length and a shift register.

In an embodiment, the ECC decoder may use a Log Likelihood Ratio Turbo Code (LLR-TC) among the methods for the soft decision decoding. The Log Likelihood Ratio (LLR) may be calculated as a non-linear function of the distance between a sampled value and an ideal value. Furthermore, Turbo Code (TC) may have a scheme that constructs a simple code (for example, Hamming code or the like) in a 2D or 3D manner, and repeats decoding in row and column directions, thereby improving reliability.

Although not illustrated, the controller 130 may encode or decode data through Erasure Coding (EC) during a process of writing data to the memory device 150 or reading data stored in the memory device 150. The EC may be understood as a data recovery method which encodes data using an erasure code, and recovers original data through a decoding process in case of data loss. Since parity data generated as erasure codes occupies a smaller storage space than when a data copy is generated, the EC can raise the efficiency of the storage space while providing the reliability of the memory system 110. In this case, various erasure codes may be used. Examples of the erasure codes may include a Reed-Solomon code, Tahoe Least-Authority File System (Tahoe-LAFS), EVENODD code, Weaver code, X-code and the like. Different algorithms may be used for the respective erasure codes, and the controller 130 may use erase codes for raising recovery performance while reducing computation complexity.

The PMU 140 may monitor a voltage applied to the memory system 110 (for example, a voltage supplied to the controller 130), and provide power to the components included in the controller 130. The PMU 140 may not only sense a power on/off, but also generate a trigger signal to trigger the memory system 110 to urgently back up the current state, when the level of the supplied voltage is unstable. In an embodiment, the PMU 140 may include a device capable of accumulating power which can be used in an emergency situation.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150. The memory I/F 142 may be driven through firmware referred to as a flash interface layer (FIL) in order to exchange data with the memory device 150.

In an embodiment, the memory I/F 142 may support an Open NAND Flash Interface (ONFi) mode, a toggle mode and the like for data input/output between the memory device 150 and the memory I/F 142. For example, the ONFi may use a data path (for example, channel or way) including a signal line which can support a bidirectional transmitting/receiving process for 8-bit or 16-bit unit data. The data communication between the controller 130 and the memory device 150 may be performed through a device which supports one or more interfaces among Asynchronous Single Data Rate (ASDR), Synchronous Double Data Rate (SDDR) and Toggle Double Data Rate (TDDR) interfaces.

The memory 144 may serve as a working memory of the memory system 110 and the controller 130, and store data required for driving the memory system 110 and the controller 130 or data generated while the memory system 110 and the controller 130 are driven. For example, the memory 144 may temporarily store read data provided from the memory device 150 before the controller 130 provides the read data to the host 102 in response to a request from the host 120. Furthermore, the controller 130 may temporarily store write data, provided from the host 102, in the memory 144 before the write storing the write data in the memory device 150. When the controller 130 controls a read, write, program or erase operation of the memory device 150, data transferred or generated between the controller 130 and the memory device 150 within the memory system 110 may be stored in the memory 144. In addition to the read or write data, the memory 144 may store information required for performing a data write or read operation between the host 102 and the memory device 150 (for example, map data, read command and program command). The memory 144 may include a command queue, a program memory, a data memory, a write buffer/cache, a read buffer/cache, a data buffer/cache, a map buffer/cache and the like. The map buffer/cache may be a device or region for storing the map information described with reference to FIG. 1.

In an embodiment, the memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a central processing unit (CPU).

In an embodiment, the processor 134 may be implemented as a multi-code processor which is a circuit having two or more cores integrated therein, the two or more cores being computation processing regions distinguished from each other. For example, when a plurality of cores within a multi-core processor drive a plurality of FTLs, respectively, the data input/output speed of the memory system 110 may be improved.

The processor 134 within the controller 130 may perform an operation corresponding to a command inputted from the host 102, and the memory system 110 may independently perform an operation regardless of a command inputted from an external device such as the host 102. Typically, an operation which the controller 130 performs in response to a command transferred from the host 102 may be understood as a foreground operation, and an operation which the controller 130 independently performs regardless of a command transferred from the host 102 may be understood as a background operation. Through the foreground operation or the background operation, the controller 130 may perform an operation for reading, writing or programming, or erasing data stored in the memory device 150. Furthermore, a parameter set operation corresponding to a set parameter command or set feature command as a set command transferred from the host 102 may also be understood as the foreground operation. As background operations without a command transferred from the host 102, the memory system 110 may perform operations for Garbage Collection (GC), Wear Leveling (WL) and bad block management in relation to the plurality of memory blocks 152, 154 and 156 included in the memory device 150. The bad block management indicates an operation of checking and processing a bad block.

Meanwhile, substantially similar operations may be performed as the foreground operation or the background operation. For example, when the memory system 110 performs manual GC in response to a command of the host 102, the manual GC may be understood as a foreground operation, and when the memory system 110 independently performs auto GC, the auto GC may be understood as a background operation.

When the memory device 150 is configured as a plurality of dies or chips each including nonvolatile memory cells, the controller 130 may process requests or commands, transferred from the host 102, in the plurality of dies or chips within the memory device 150 at the same time, in order to improve the performance of the memory system 110. The memory I/F 142 within the controller 130 may be coupled to the plurality of dies or chips within the memory device 150 through one or more channels and one or more ways. When the controller 130 distributes and stores data through the respective channels or ways in order to process a request or command corresponding to a plurality of pages each configured as nonvolatile memory cells, operations for the corresponding request or command may be performed at the same time or in parallel. Such a processing method may be understood as an interleaving method. Since the data input/output speed of the memory system 110 which can operate according to the interleaving method may be higher than that of each die or chip within the memory device 150, the interleaving method may improve the data input/output performance of the memory system 110.

The controller 130 may check the states of the plurality of channels or ways coupled to the plurality of memory dies included in the memory device 150. For example, the states of the channels or ways may be divided into a busy state, a ready state, an active state, an idle state, a normal state, an abnormal state and the like. In response to a channel or way through which a command, request and/or data are transferred, the controller 130 may determine the physical address of data to be stored. The controller 130 may refer to a descriptor transferred from the memory device 150. The descriptor is data with a predetermined format or scheme, and may include a block or page of a parameter which describes something about the memory device 150. For example, the descriptor may include a device descriptor, a configuration descriptor, a unit descriptor and the like. The controller 130 refers to or uses a descriptor to determine through which channel(s) or method(s) commands or data are exchanged.

The memory device 150 within the memory system 110 may include the plurality of memory blocks 152, 154 and 156. Each of the memory blocks 152, 154 and 156 includes a plurality of nonvolatile memory cells. Although not illustrated, each of the memory blocks 152, 154 and 156 may have a 3D stack structure depending on embodiments.

The plurality of memory blocks 152 to 156 included in the memory device 150 may include a single level cell (SLC) memory block storing 1-bit data and/or a multi-level cell (MLC) memory block storing multi-bit data. The SLC memory blocks may include a plurality of pages that are realized by memory cells storing one-bit data in one memory cell. The SLC memory blocks may have a quick data operation performance and high durability. On the other hand, the MLC memory blocks may include a plurality of pages that are realized by memory cells storing multi-bit data, e.g., data of two or more bits, in one memory cell. The MLC memory blocks may have a greater data storing space than the SLC memory blocks. In other words, the MLC memory blocks may be highly integrated.

The MLC memory blocks may include double level cell (DLC) memory blocks which includes a plurality of pages that are realized by memory cells capable of storing two-bit data in one memory cell, triple level cell (TLC) memory blocks which includes a plurality of pages that are realized by memory cells capable of storing three-bit data in one memory cell, quadruple level cell (QLC) memory blocks which includes a plurality of pages that are realized by memory cells capable of storing four-bit data in one memory cell, or multiple level cell memory blocks which includes a plurality of pages that are realized by memory cells capable of storing two-bit data in one memory cell.

In an embodiment, the controller 130 may operate an MLC memory block included in the memory device 150, like an SLC memory block which stores 1-bit data in one memory cell. For example, the controller 130 may operate a part of the MLC memory block as an SLC memory block by utilizing the data input/output speed of the part of the MLC memory block, which may be higher than that of the other part of the MLC memory block. Thus, the part of the MLC memory block may be used as a buffer for temporarily storing data.

In an embodiment, the controller 130 may program data to the MLC memory block included in the memory device 150 a plurality of times without an erase operation. In general, the nonvolatile memory cell is characterized in that it does not support overwrite. However, based on such a characteristic that the MLC memory block can store multi-bit data, the controller 130 may program 1-bit data to a nonvolatile memory cell a plurality of times. For this operation, the controller 130 may store, as separate operation information, the number of times that the data is programmed to the nonvolatile memory cell, and perform a uniformity operation for uniformizing the level of the threshold voltage of the nonvolatile memory cell before data is reprogrammed to the same nonvolatile memory cell.

In an embodiment, the memory device 150 may be implemented as a memory device such as Read Only Memory (ROM), Mask ROM (MROM), Programmable ROM (PROM), Erasable ROM (EPROM), Electrically Erasable ROM (EEPROM), Ferromagnetic ROM (FRAM), Phase change RAM (PRAM), Magnetic RAM (MRAM), Resistive RAM (RRAM), NAND or NOR flash memory, Phase Change Random Access Memory (PCRAM), Resistive Random Access Memory (RRAM or ReRAM), Ferroelectrics Random Access Memory (FRAM) or Spin Transfer Torque Magnetic Random Access Memory (STT-RAM or STT-MRAM).

Figure 2:
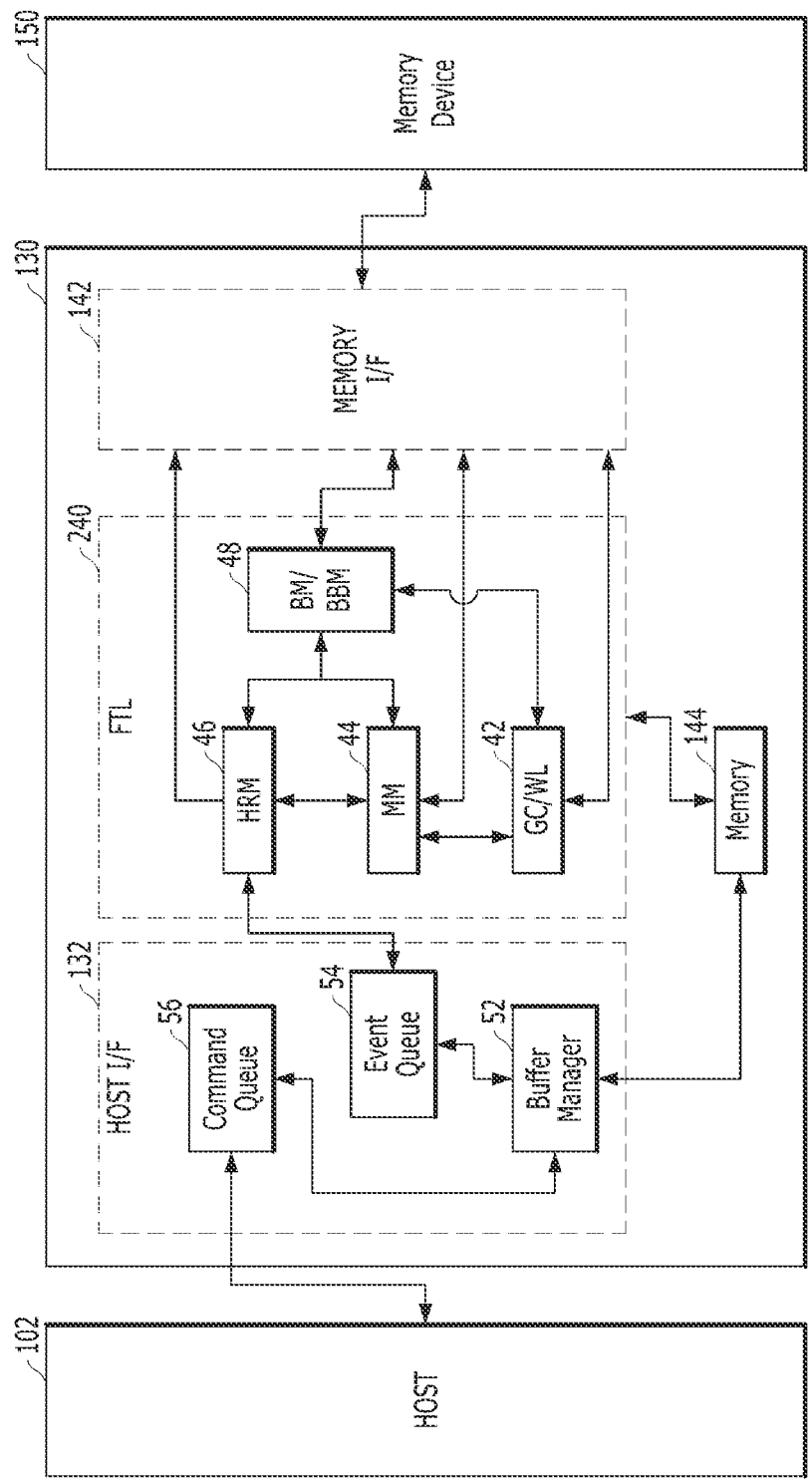
FIG. 2 illustrates a memory system in accordance with an embodiment.

FIG. 2 illustrates a memory system in accordance with an embodiment of the present disclosure.

Referring to FIG. 2, the controller 130 interworking with the host 102 and the memory device 150 may include a host I/F 132, an FTL 240, a memory I/F 142 and a memory 144. As an embodiment of the FTL 240 described with reference to FIG. 2, the FTL 240 may be implemented in various shapes depending on the operation performance of the memory system 110.

The host interface 132 is for handling commands, data, and the like transmitted from the host 102. By way of example but not limitation, the host interface 132 may include a command queue 56, a buffer manager 52, and an event queue 54. The command queue 56 may sequentially store commands, data, and the like received from the host 102 and output them to the buffer manager 52 in an order in which they are stored. The buffer manager 52 may classify, manage, or adjust the commands, the data, and the like, which are received from the command queue 56. The event queue 54 may sequentially transmit events for processing the commands, the data, and the like received from the buffer manager 52.

A plurality of commands or data of the same characteristic, e.g., read or write commands, may be transmitted from the host 102, or commands and data of different characteristics may be transmitted to the memory system 110 after being mixed or jumbled by the host 102. For example, a plurality of commands for reading data (read commands) may be delivered, or commands for reading data (read command) and programming/writing data (write command) may be alternately transmitted to the memory system 110.

The host interface 132 may store commands, data, and the like, which are transmitted from the host 102, to the command queue 56 sequentially.

Thereafter, the host interface 132 may estimate or predict what kind of internal operation the controller 130 will perform according to the characteristics of commands, data, and the like, which have been entered from the host 102. The host interface 132 can determine a processing order and a priority of commands, data and the like, based at least on their characteristics. According to characteristics of commands, data, and the like transmitted from the host 102, the buffer manager 52 in the host interface 132 is configured to determine whether the buffer manager should store commands, data, and the like in the memory 144, or whether the buffer manager should deliver the commands, the data, and the like into the flash translation layer (FTL) 240.

The event queue 54 receives events, entered from the buffer manager 52, which are to be internally executed and processed by the memory system 110 or the controller 130 in response to the commands, the data, and the like transmitted from the host 102, so as to deliver the events into the flash translation layer (FTL) 40 in the order received.

In accordance with an embodiment, the flash translation layer (FTL) 240 can include a host request manager (HRM) 46, a map manager (MM) 44, a state manager 42, and a block manager 48. The host request manager (HRM) 46 can manage the events entered from the event queue 54. The map manager (MM) 44 can handle or control a map data. The state manager 42 can perform garbage collection (GC) or wear leveling (WL). The block manager 48 can execute commands or instructions onto a block in the memory device 150. Although not illustrated in FIG. 2, the ECC 138 described with reference to FIG. 1 may be included in the FTL 240, depending on an embodiment. In an embodiment, the ECC 138 may be implemented as a separate module, circuit or firmware within the controller 130.

By way of example but not limitation, the host request manager (HRM) 46 can use the map manager (MM) 44 and the block manager 48 to handle or process requests according to the read and program commands, and events which are delivered from the host interface 132. The host request manager (HRM) 46 can send an inquiry request to the map data manager (MM) 44, to determine a physical address corresponding to the logical address which is entered with the events. The HRM 46 may send an inquiry request to the MM 44 in order to identify a physical address corresponding to the logical address of the transferred request, and the MM 44 may perform address translation. The HRM 46 may transmit a flash read request to the memory I/F 142 for the physical address, in order to process the read request. The HRM 46 may first transmit a program request to the BM 48 and program data to an unwritten specific page of the memory device, which has no data stored therein, and then transmit a map update request for the program request to the MM 44, thereby updating the contents of the programmed data in the mapping information between the logical and physical addresses.

Here, the block manager 48 can convert a program request delivered from the host request manager (HRM) 46, the map data manager (MM) 44, and/or the state manager 42 into a flash program request used for the memory device 150, to manage flash blocks in the memory device 150. In order to maximize or enhance program or write performance of the memory system 110 (see FIG. 2), the block manager 48 may collect program requests and send flash program requests for multiple-plane and one-shot program operations to the memory interface 142. In an embodiment, the block manager 48 sends several flash program requests to the memory interface 142 to enhance or maximize parallel processing (e.g., an interleaving operation) of the multi-channel and multi-directional flash controller.

On the other hand, the block manager 48 can be configured to manage blocks in the memory device 150 according to the number of valid pages, select and erase blocks having no valid pages when a free block is needed, and select a block including the least number of valid pages when it is determined that garbage collection is necessary. The state manager 42 can perform garbage collection to move the valid data to an empty block and erase the blocks containing the moved valid data so that the block manager 48 may have enough free blocks (empty blocks with no data). If the block manager 48 provides information regarding a block to be erased to the state manager 42, the state manager 42 could check all flash pages of the block to be erased to determine whether each page is valid. For example, to determine validity of each page, the state manager 42 can identify a logical address recorded in an out-of-band (OOB) area of each page. To determine whether each page is valid, the state manager 42 can compare the physical address of the page with the physical address mapped to the logical address obtained from the inquiry request. The state manager 42 sends a program request to the block manager 48 for each valid page. A mapping table can be updated through the update of the map manager 44 when the program operation is complete.

The map manager 44 can manage a logical-physical mapping table. The map manager 44 can process requests such as queries, updates, and the like, which are generated by the host request manager (HRM) 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request can be sent to the block manager 48 so that a clean cache block is made and the dirty map table may be stored in the memory device 150.

On the other hand, when garbage collection is performed, the state manager 42 copies valid page(s) into a free block, and the host request manager (HRM) 46 can program the latest version of the data for the same logical address of the page and currently issue an update request. When the status manager 42 requests the map update in a state in which copying of valid page(s) is not completed normally, the map manager 44 might not perform the mapping table update. It is because the map request is issued with old physical information if the status manger 42 requests a map update and a valid page copy is completed later. The map manager 44 may perform a map update operation to ensure accuracy only if the latest map table still points to the old physical address.

FIGS. 3A to 3D are graphs for describing threshold voltage distributions of memory cells. Referring to FIGS. 3A to 3D, the horizontal axis of each graph indicates the magnitude of a threshold voltage, and the vertical axis thereof indicates the number of memory cells. FIGS. 3A to 3D are based on the supposition that the number of data bits stored in one memory cell ranges from one to four. However, the number of data bits stored in one memory cell is not limited to the present embodiment.

FIG. 3A illustrates threshold voltage distributions of an SLC capable of storing one data bit therein. The SLC may have any one state of an erase state E and a program state P1. A read voltage Va1 may be a read voltage for distinguishing between the erase state E and the program state P1. The SLC having the erase state E may be read as an on-cell, when read through the read voltage Va1. The SLC having the program state P1 may be read as an off-cell, when read through the read voltage Va1.

FIG. 3B illustrates threshold voltage distributions of an MLC capable of storing two data bits therein. The MLC may have any one state of the erase state E and first to third program states P1 to P3. First to third read voltages Vb1 to Vb3 may be read voltages for distinguishing among the erase state E and the first to third program states P1 to P3. The first read voltage Vb1 may be a read voltage for distinguishing between the erase state E and the first program state P1. The second read voltage Vb2 may be a read voltage for distinguishing between the first program state P1 and the second program state P2. The third read voltage Vb3 may be a read voltage for distinguishing between the second program state P2 and the third program state P3. The state of the MLC may be sorted into any one of the erase state E or the first to third program states P1 to P3 according to a read result through the first to third read voltages Vb1 to Vb3.

Figure 3C:
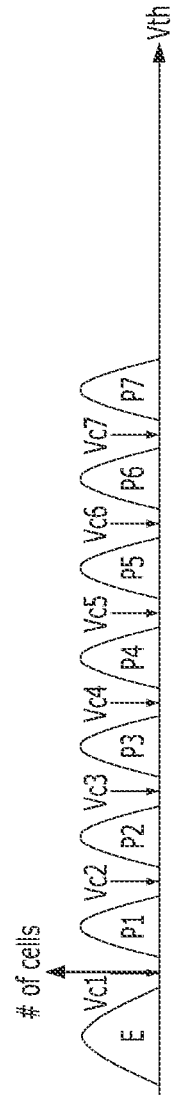

FIG. 3C illustrates threshold voltage distributions of a TLC (Triple Level Cell) capable of storing three data bits therein. The TLC may have any one state of the erase state E and first to seventh program states P1 to P7. First to seventh read voltages Vc1 to Vc7 may be read voltages for distinguishing among the erase state E and the first to seventh program states P1 to P7. The first read voltage Vc1 may be a read voltage for distinguishing between the erase state E and the first program state P1. The second read voltage Vc2 may be a read voltage for distinguishing between the first program state P1 and the second program state P2. Similarly, the seventh read voltage Vc7 may be a read voltage for distinguishing between the sixth program state P6 and the seventh program state P7. The state of the TLC may be sorted into any one of the erase state E and the first to seventh program states P1 to P7 according to a read result through the first to third read voltages Vc1 to Vc7.

Figure 3D:
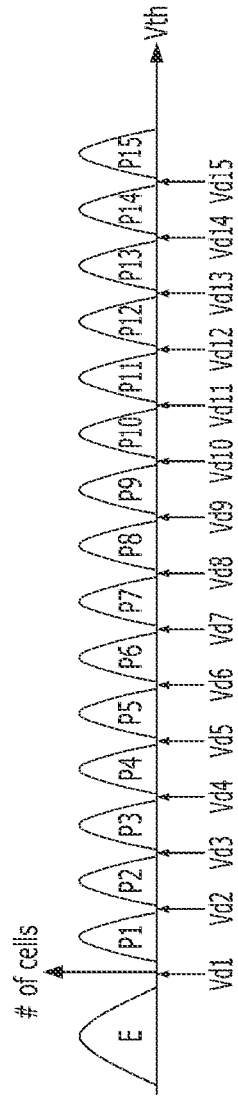

FIG. 3D illustrates threshold voltage distributions of a QLC (Quad Level Cell) capable of storing four data bits therein. The QLC may have any one state of the erase state E and first to 15th program states P1 to P15. First to 15th read voltages Vd1 to Vd15 may be read voltages for distinguishing among the erase state E and the first to 15th program states P1 to P15. The first read voltage Vd1 may be a read voltage for distinguishing between the erase state E and the first program state P1. The second read voltage Vd2 may be a read voltage for distinguishing between the first program state P1 and the second program state P2. Similarly, the 15th read voltage Vd15 may be a read voltage for distinguishing between the 14th program state P14 and the 15th program state P15. The state of the QLC may be sorted into any one of the erase state E and the first to 15th program states P1 to P15 according to a read result through the first to 15th read voltages Vd1 to Vd15.

Referring to FIGS. 3A to 3D, the number of program states represented by one memory cell and the number of read voltages for distinguishing among the program states may increase as the number of data bits stored in one memory cell is increased. With the increase in number of program states represented by one memory cell, the entire width of the threshold voltage distributions corresponding to the respective program states may be increased. On the other hand, with the increase in number of program states represented by one memory cell, the width of the threshold voltage distribution corresponding to each of the program states may be decreased.

Figure 4:
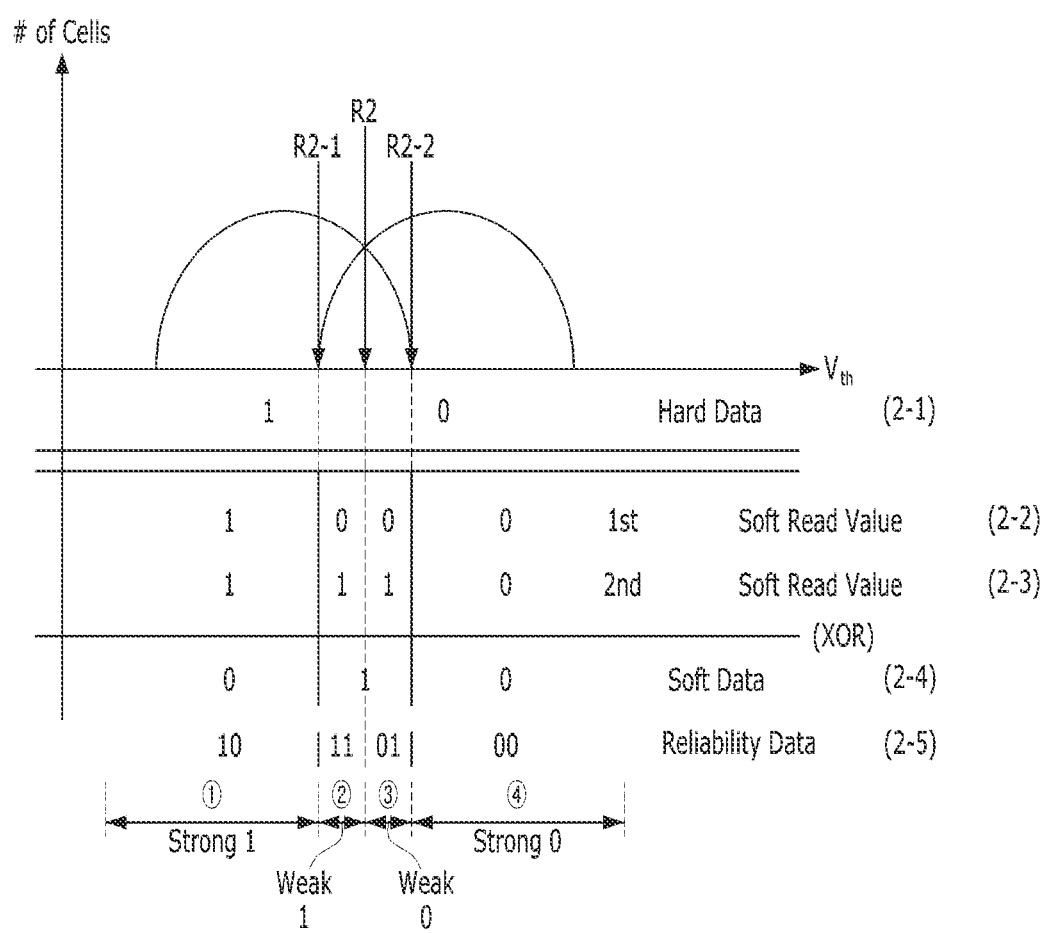
FIG. 4 is a graph illustrating that read voltages and soft data are formed during a 2-bit soft read operation.

FIG. 4 is a graph illustrating that read voltages and soft data are formed during a 2-bit soft read operation.

Before FIG. 4 is described, the processor 134 included in the controller 130 will be described as follows. The processor 134 may generate a command and apply the generated command to the memory device 150, in order to analyze a command transferred from the host 102 and control overall operations of the memory device 150 according to the analysis result. For example, when receiving a read command from the host 102, the processor 134 may apply the read command to the memory device 150 in order to process the read command. At this time, the processor 134 may provide the memory device 150 with a hard read command (hard decision read command) and a soft read command (soft decision read command). The memory device 150 may perform a hard read operation and a soft read operation based on the received read commands.

Referring to FIG. 4, the hard read operation refers to an operation of reading data programmed in a plurality of memory cells using a preset hard read voltage. When the hard read voltage is applied, data is read as 1 or 0 according to the on or off states of the memory cells. The hard read voltage is represented by R2. When the hard read voltage R2 is applied, hard data 2-1 becomes '1' in the case that the memory cell is in the on state, and becomes '0' in the case that the memory cell is in the off state. That is, the hard data may indicate data which are read from memory cells MC through the hard read operation based on the hard read voltage, and stored in the memory cells MC through a program operation. Depending on whether the threshold voltage of a memory cell is higher/lower than the hard read voltage, the hard data may be read as "0" or "1" for the corresponding memory cell.

The soft read operation refers to an operation of applying a plurality of variable read voltages (soft read voltages) having a predetermined voltage difference from the hard read voltage R2, and forming information for adding reliability to the hard data. That is, the soft read voltages may be used to read soft data from the memory cells MC during the soft read operation. The soft data may be read depending on whether the threshold voltages of the memory cells are higher/lower than the soft read voltages. For example, in the case of a 2-bit soft decision read operation, the soft decision read voltages become a first soft read voltage R2-1 and a second soft read voltage R2-2, respectively. When the first soft read voltage R2-1 is applied, a first soft read value 2-2 which is determined according to the on or off state of a memory cell may become 1, 0, 0 and 0. When the second soft read voltage R2-2 is applied, a second soft read value 2-3 which is determined according to the on or off state of the memory cell may become 1, 1, 1 and 0.

The first soft read value 2-2 and the second soft read value 2-3 are subjected to a logic gate operation in order to form soft data 2-4. Specifically, an XOR operation may be performed to generate the soft data. When the XOR operation is performed on the first and second soft read values, the operation result may be expressed as '0' in the case that the first and second soft read values at the same position coincide with each other, and expressed as '1' in the case that the first and second soft read values at the same position do not coincide with each other. Therefore, the generated soft data 2-4 may become 0, 1 and 0. The generated soft data 2-4 is provided to an ECC decoder 1301 included in the controller (see 130 in FIG. 13). The soft data may add reliability to the hard data. That is, when the soft data 2-4 is '0', it may indicate that the reliability of the hard data is strong, and when the soft data 2-4 is '1', it may indicate that the reliability of the hard data is weak. That is, reliability data 2-5 based on the hard data and the soft data may have values of 10, 11, 01 and 00 in sections ①, ②, ③ and ④, respectively. However, the present embodiment is not limited thereto, and the reliability data 2-5 based on hard data HDT and soft data SDT may be set to different values. The memory system 110 may process data (bit), read from a memory cell having a threshold voltage included in the section ① where the reliability data is identified as 10, as strong 1 which indicates that the corresponding data (bit) value is identified as 1, or the probability that the data (bit) is 1 is high. That is, the memory system 110 may apply a weight of strong 1 to the data (bit) read from the memory cell having a threshold voltage included in the section ① where the reliability data 2-5 is identified as 10. The memory system 110 may process data (bit), read from a memory cell having a threshold voltage included in the section ② where the reliability data 2-5 is identified as 11, as weak 1 which indicates that the corresponding data (bit) value is identified as weak 1, but the probability that the data (bit) is 1 is low. That is, the memory system 110 may apply a weight of weak 1 to the data (bit) read from the memory cell having a threshold voltage included in the section ② where the reliability data 2-5 is identified as 11. Similarly, the memory system 110 may process data (bit), read from a memory cell having a threshold voltage included in the section ③ where the reliability data 2-5 is identified as 01, by applying a weight of weak 0 indicating that the corresponding data (bit) is identified as 0, and the probability that the data (bit) is 0 is low. Similarly, the memory system 110 may process data (bit), read from a memory cell having a threshold voltage included in the section ④ where the reliability data 2-5 is identified as 00, by applying a weight of strong 0 indicating that the corresponding data (bit) is identified as 0, and the probability that the data (bit) is 0 is high.

When the memory device 150 transfers soft data read from a plurality of memory cells to the controller 130 through the soft read operation, the controller 130 may detect and correct an error of the hard data by using the soft data.

When the memory device 150 compresses the soft data and then transfers the compressed data to the controller 130, the information transfer efficiency of the soft data may be raised, and the power consumptions of the memory device 150 and the controller 130 may be reduced, compared to when the memory device 150 transfers the soft data without compressing the soft data. Most of the plurality of memory cells may be memory cells whose reliabilities are strong, and have data values indicating that the reliability is strong in the soft data. For example, most of the bits constituting the soft data 2-4 described with reference to FIG. 4 may be '0'. When the memory device 150 generates compressed data by compressing the soft data, repetitions of the '0' bit may be compressed into short length data, which makes it possible to improve the compression ratio of the compressed data.

In accordance with the present embodiment, the memory device 150 may compress repetitions of the '0' bit (hereinafter, referred to as 0-bit repetitions) of a first length in the soft data into 1-bit compressed data. The memory device 150 may compress 0-bit repetitions of a shorter length than the first length and ending with a bit of '1' into compressed data having a longer length than the 1-bit compressed data.

When the memory device 150 generates the compressed data from the soft data with an improved compression ratio and provides the compressed data to the controller 130, the information transfer efficiency of the soft data may be improved, and the power consumptions of the memory device 150 and the controller 130 may be reduced. In one embodiment, the term repetition may include a successive sequence of two or more bit values as discussed above.

Examples of a method for compressing soft data and a method for decompressing compressed data in accordance with the present embodiment will be described in detail with reference to FIGS. 5 to 9.

The soft data described with reference to FIG. 4 may be binary data. The binary soft data may include a source symbol, and the source symbol may have a value of '0' or '1'. The symbol '0' and the symbol '1' in the soft data may have different occurrence probabilities. For example, when a symbol indicating that the reliability is strong in the soft data is '0' and a symbol indicating that the reliability is weak in the soft data is '1', most of the symbols of the soft data may be '0', and the others of the symbols may be '1'. Hereafter, in the soft data, a symbol having a symbol value whose occurrence probability is the highest may be referred to as a major symbol, and symbols other than the major symbol may be referred to as minor symbols.

The memory device 150 may divide the soft data into a plurality of predetermined source alphabets in order to compress the soft data, and encode the soft alphabets into code alphabets through an entropy coding method, in order to generate compressed data.

Each of the source alphabets may include one or more source symbols. In accordance with the present embodiment, each of the predetermined source alphabets may not be the prefix of another source alphabet. When each of the predetermined source alphabets is not the prefix of another source alphabet, it may indicate that a normal source alphabet is not the prefix of another source alphabet. For example, the plurality of source alphabets may have values of '1', '01', '001', '0001' and '0000', respectively. In the above example, a source alphabet '1' is not the prefix of any one of the other source alphabets '01', '001', '0001' and '0000'. Similarly, any one of the source alphabets '01', '001', '0001' and '0000' is not the prefix of other source alphabets.

Since each of the source alphabets is not the prefix of another source alphabet, the memory device 150 may instantaneously and uniquely encode the soft data. That is, the memory device 150 may detect a plurality of source alphabets from the soft data by instantaneously checking the respective symbols of the soft data, and encode the plurality of source alphabets into code alphabets, in order to generate the compressed data. The soft data and the compressed data may have a one-to-one correlation therebetween.

The memory device 150 may use the entropy encoding method to compress the soft data. The entropy encoding method refers to a compression method for compressing data by encoding a source alphabet, which has a higher occurrence probability among the source alphabets included in the data, into a code alphabet having a smaller length. For example, when the memory device 150 divides the soft data into a plurality of source alphabets, the occurrence probability of the source alphabet '0000' in the soft data may be higher than those of the other source alphabets '1', '01', '001' and '0001'. The memory device 150 may encode the source alphabet '0000' into the code alphabet having the smallest length.

The memory device 150 may store a compression table including a plurality of source alphabets and a plurality of code alphabets corresponding to the plurality of source alphabets. FIG. 5 illustrates a first compression table 500 in accordance with an embodiment. The first compression table 500 illustrates 17 source alphabets of '1', '01', '001', . . . , and '0000000000000000'. Each of the source alphabets may not be the prefix of another source alphabet. The memory device 150 may instantaneously check the symbols of the soft data and divide the soft data into the plurality of source alphabets.

For example, when the result obtained by instantaneously checking the symbols of the soft data indicates that the soft data includes the 0-bit repetitions of the length of 16 symbols, the memory device 150 may determine the 0-bit repetitions of the length of 16 symbols as the source alphabet '0000000000000000'. When the soft data includes the 0-bit repetitions of the length of five symbols and ending with a bit of '1', the memory device 150 may determine the 5 bits of the 0-bit repetitions ending with the bit of '1' as an alphabet '000001'.

The memory device 150 may encode the source alphabet having the highest occurrence probability, among the source alphabets, into the shortest code alphabet. The occurrence probabilities of the source alphabets may be expressed as Equation 1 below.

$$P(x) = \begin{cases} (1-p)^{k-1} p & \ldots x \neq \text{all zero} \\ (1-p)^{k} = p & \ldots x = \text{all zero} \end{cases} \quad \text{[Equation 1]}$$

In Equation 1, x may represent a source alphabet, and P(x) may represent the occurrence probability of the source alphabet x. Furthermore, 1−p may represent the probability that a major symbol (for example, a symbol having the value of '0') will occur in the soft data, and p may represent the probability that a minor symbol (for example, a symbol having the value '1') will occur in the soft data. In addition, k may represent a length of a source alphabet. Furthermore, $(1-p)^{k_{max}}$ may represent the probability that an alphabet configured only by a major symbol (i.e., an alphabet as the major-symbol repetitions of the maximum length '$k_{max}$') will occur in the soft data. For example, when a source alphabet has a maximum length of 16 symbols in the compression table, the occurrence probability of a source alphabet as the 0-bit repetitions (i.e., the major-symbol repetitions) of the maximum length may be $P(x)=(1-p)^{16}$. In addition, $(1-p)^{k-1}p$ may indicate the occurrence probability of a source alphabet as the major-symbol repetitions of a length of (k−1) bits and ending with one minor symbol. For example, the probability that the alphabet '0001' will occur may be $P(x)=(1-p)^3 p$.

Since the major symbol is the major in the soft data, the probability P that minor symbols will occur may be smaller than 1−p. According to Equation 1, the source alphabet '0000000000000000', i.e., the source alphabet as the major-symbol repetitions of the maximum length '$k_{max}$' may have the highest occurrence probability. The code alphabet corresponding to the source alphabet having the highest occurrence probability, among the plurality of code alphabets of the first compression table 500, may have the smallest length. In the example of FIG. 5, the code alphabet corresponding to the source alphabet as the major-symbol repetitions of the maximum length '$k_{max}$', namely '0000000000000000' may be '0'. That is, the code alphabet may be predetermined to have a length of only one bit. On the other hand, code alphabets corresponding to the other 16 source alphabets except the source alphabet as the major-symbol repetitions of the maximum length '$k_{max}$', namely '0000000000000000' among the source alphabets may be predetermined to have a length of five bits. The first digit of each of the 5-bit code alphabets may have a value of '1', and the other digits thereof may be randomly set to different values for each of the source alphabets. The source alphabet having the highest occurrence probability among the plurality of source alphabets may be referred to as a major source alphabet, and the other source alphabets may be referred to as minor source alphabets.

FIG. 6 illustrates soft data and compressed data. Specifically, the compressed data of FIG. 6 may be compressed data which is generated when the memory device 150 compresses the soft data based on the first compression table 500.

The soft data of FIG. 6 may have a value of '00000 00000 00000 00010 00000 00000 00000 00001 00001 00001'. The memory device 1540 may divide the soft data into a plurality of source alphabets. Since each of the source alphabets is not the prefix of another source alphabet, the memory device 150 may instantaneously check the symbols of the soft data, and divide the soft data into the plurality of source alphabets. For example, the memory device 150 may divide the soft data into a total of 6 source alphabets of '00000 00000 00000 0', '001', '00000 00000 00000 0', '00001', '00001' and '00001'.

The memory device 150 may encode the six source alphabets into six code alphabets '0', '10010', '0', '10011', '10011' and '10011' by referring to the first compression table 500. That is, the memory device 150 may generate compressed data '0100100100111001110011' by encoding the six source alphabets into the six code alphabets. In the example of FIG. 6, the 50-bit soft data may be expressed as the 22-bit compressed data.

In accordance with the present embodiment, the memory device 150 may encode the source alphabet having the highest occurrence probability, among the plurality of source alphabets, into the shortest code alphabet. In addition, the source alphabet having the highest occurrence probability may have the largest length among the plurality of source alphabets. Therefore, the memory device 150 can encode the source alphabet having the largest length into the shortest code alphabet, thereby improving the compression ratio of the soft data.

The memory device 150 may provide the controller 130 with the compressed data generated by compressing the soft data. The controller 130 may generate decompressed data by decompressing the compressed data. The controller 130 may perform soft decision decoding based on the decompressed data.

The controller 130 may store a decompression table including a plurality of code alphabets and a plurality of source alphabets corresponding to the plurality of code alphabets. The controller 130 may decompress the compressed data received from the memory device 150 by referring to the decompression table.

Figures 7, 8:
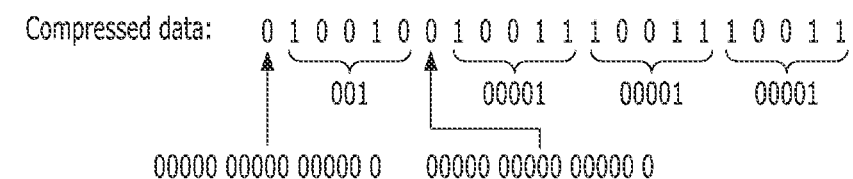
FIG. 7 illustrates a first decompression table in accordance with an embodiment.
FIG. 8 illustrates compressed data and decompressed data.

FIG. 7 illustrates a first decompression table 700 in accordance with an embodiment.

The first decompression table 700 may include the same source alphabets and code alphabets as those of the first compression table 500 described with reference to FIG. 5. While the first compression table 500 is a table for encoding a source alphabet into a code alphabet, the first decompression table 700 may be a table for decoding a code alphabet into a source alphabet.

Each of the code alphabets may be predetermined not to be the prefix of another code alphabet. In the example of FIG. 7, the code alphabets other than the code alphabet '0', among the plurality of code alphabets, may start with '1'. Therefore, the code alphabet '0' may not be the prefix of each of the other code alphabets. Since the code alphabets starting with '1' have the same length of five bits and have difference values, each of the code alphabets may not be the prefix of another code alphabet. Since each of the code alphabets is not the prefix of another code alphabet, the controller 130 may instantaneously and uniquely decode the compressed data.

FIG. 8 illustrates compressed data and decompressed data.

Specifically, the compressed data of FIG. 8 may be equal to the compressed data illustrated in FIG. 6. The decompressed data of FIG. 8 may be data which is generated when the controller 130 decompresses the compressed data of FIG. 8 based on the decompression table 700.

Since each of the code alphabets is not the prefix of another code alphabet, the controller 130 may instantaneously check the compressed data of '0100100100111001110011', and divide the compressed data into a plurality of code alphabets. Specifically, the code alphabet starting with '0' is only the code alphabet '0'. Thus, when reading the first bit '0' of the compressed data, the controller 130 may determine the corresponding bit '0' as the code alphabet '0'. The code alphabets starting with '1' all have a length of five bits. Thus, when reading the second bit '1' of the compressed data, the controller 130 may determine a total of five bits '10010' from the corresponding bit as one code alphabet. The controller 130 may determine a bit '0' following '10010' as the code alphabet '0'. Finally, the compressed data '0100100100111001110011' may be divided into a total of six code alphabets of '0', '10010', '0', '10011', '10011' and '10011'.

The controller 130 may decode the six code alphabets into the source alphabets of '00000 00000 00000 0', '001', '00000 00000 00000 0', '00001', '00001' and '00001' by referring to the decompression table 700. The controller 130 may generate the decompressed data '00000 00000 00000 00010 00000 00000 00000 00001 00001 00001' based on the source alphabets.

As the result obtained by instantaneously checking the soft data and dividing the soft data into the source alphabets, symbols which do not correspond to any one of the source alphabets of the compression table 500 may occur. For example, when the controller 130 detects the source alphabets by instantaneously checking the soft data, the remaining symbols which do not correspond to any one of the source alphabets, for example, '000000' may occur in the last part of the soft data.

In accordance with the present embodiment, the memory device 150 may add end data to an end of the soft data and generate compressed data by compressing the soft data to which the end data is added. The memory device 150 may not leave any remaining symbol uncompressed in the soft data by adding the end data to the end of the soft data. The remaining symbol and the end data will be described in detail with reference to FIG. 9.

Figures 9, 10A:
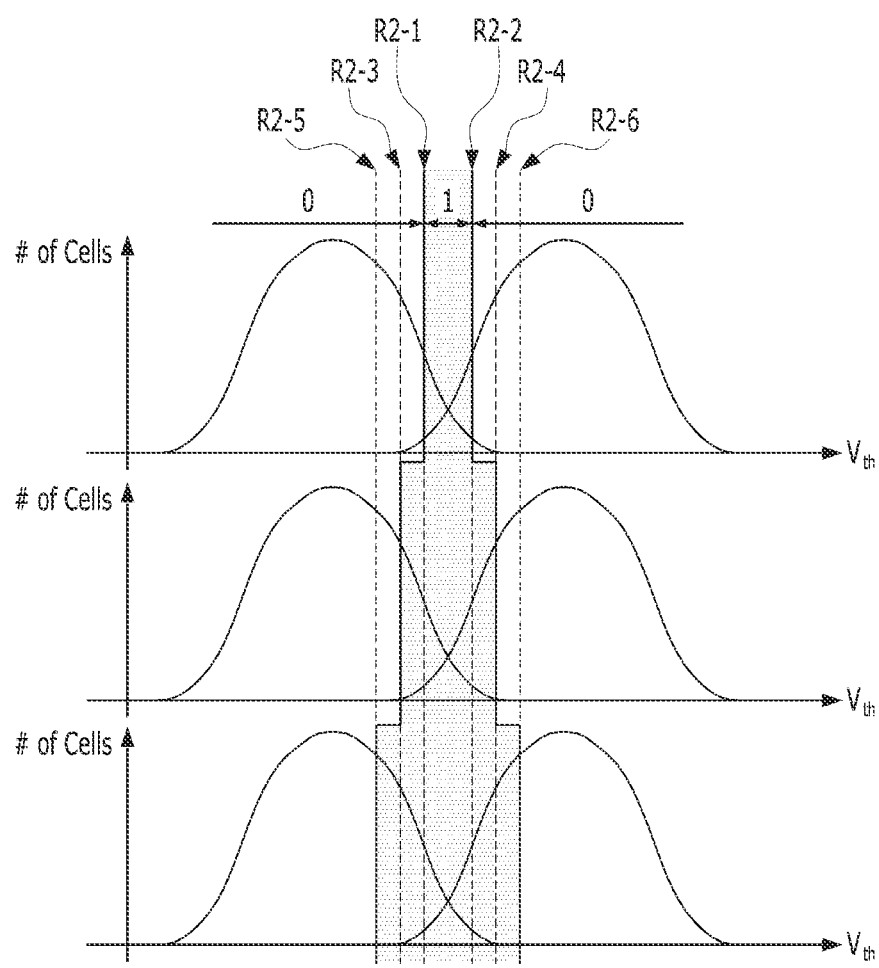
FIG. 9 is a diagram for describing end data in accordance with an embodiment.
FIGS. 10A to 10C are diagrams for describing a first soft data generation method and a first-type compression table.

FIG. 9 is a diagram for describing end data in accordance with an embodiment.

Specifically, FIG. 9 illustrates soft data to which end data is added, compressed data of the soft data, and decompressed data of the compressed data.

In the example of FIG. 9, the soft data may be '00000 00000 00000 00010 00000 00000 00000 00001 00001 00000'. When the memory device 150 instantaneously checks the symbols of the soft data and divides the symbols into source alphabets, 45 symbols '00000 00000 00000 00010 00000 00000 00000 00001 00001' from the head of the soft data may be divided into '00000 00000 00000 0', '001', '00000 00000 00000 0', '00001' and '00001'. However, the last five symbols '00000' may be the remaining symbols which do not belong to any one of the source alphabets of the compression table 500. In this case, it may be difficult to compress the remaining symbols by using the compression table 500.

The memory device 150 may add end data of a minor symbol to the end of the soft data in order to compress even the remaining symbols by using the compression table 500.

For example, when the memory device 150 adds the end data of the minor symbol '1' to the end of the soft data, the last six symbols may become '000001'. Since '000001' belongs to a source alphabet of the compression table 500, the memory device 150 may compress '000001' into '10101' by referring to the compression table 500. That is, when the memory device 150 adds the predetermined end data of the minor symbol to the end of the soft data, the memory device 150 may normally compress all symbols without the remaining symbols. In accordance with the present embodiment, the end data may be configured as one minor symbol, for example, '1'.

When the end data is added to the soft data, the length of the compressed data may be increased by several bits, compared to when no end data is added thereto. In an implementation, the soft data and the compressed data may range from several thousands of bits to several tens of thousands of bits. Therefore, although several-bit data is further added to the compressed data, almost no overhead may be increased when the memory device 150 transmits the compressed data to the controller 130.

The controller 130 may generate decompressed data by instantaneously decompressing the compressed data received from the memory device 150. When the compressed data is normally received, the decompressed data may be equal to the soft data of which the end data is added to the end. The soft data may have a predetermined size according to the page size of a NAND flash memory 170. Therefore, normal decompressed data may have a determined length.

The controller 130 may count the number of bits in the decompressed data which is instantaneously generated, in order to determine whether the decompressed data is normal decompressed data. When the counted bit number corresponds to a predetermined number, the controller 130 may determine whether the last bit of the decompressed data is equal to the end data. When the last bit is equal to the end data, the controller 130 may determine that the decompressed data is normal decompressed data. When the decompressed data is normal decompressed data, the controller may remove end data from the decompressed data, the controller may remove end data from the decompressed data to generate soft data and perform soft decision decoding by using the generated soft data.

In the example of FIG. 9, when the number of bits in the decompressed data which is instantaneously generated corresponds to 51 and the last bit of the 51-bit data has a value of '1', the controller 130 may determine that the compressed data has been normally received.

The memory device 150 may store one or more compression tables, and the controller 130 may store one or more decompression tables corresponding to the one or more compression tables. When the memory device 150 stores a plurality of compression tables, the memory device 150 may select any one of the plurality of compression tables based on the reliability of hard data and a soft data generation method. Various examples of a plurality of soft data generation methods and compression tables of the memory device 150 will be described in detail with reference to FIGS. 10A to 10C, 11A to 11C and 12A and 12B.

Figures 10B, 10C:
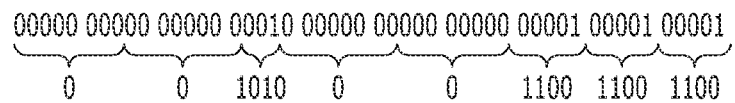

FIGS. 10A to 10C are diagrams for describing a first soft data generation method and a first-type compression table.

FIG. 10A is a graph for describing the first soft data generation method.

A method in which the memory device 150 acquires two soft read values by using a pair of soft read voltages and generates soft data by performing an XOR operation on the two soft read values may be referred to as the first soft data generation method. The first soft data generation method may be performed in substantially the same manner as the soft read operation described with reference to FIG. 4. Among bits of first soft data generated by the first soft data generation method, '0' may indicate that the reliability is strong, and '1' may indicate that the reliability is weak. That is, the soft data generated by the first soft data generation method may include reliability information of one bit per memory cell.

The memory device 150 may use any one pair of soft read voltages among a plurality of soft read voltages, under control of the controller 130. FIG. 10A illustrates first to sixth soft read voltages R2-1 to R2-6. FIG. 10A illustrates soft data bit values depending on the threshold voltages of the memory cells in the case that the memory device 150 uses the first and second soft read voltages R2-1 and R2-2, the case that the memory device 150 uses the third and fourth soft read voltages R2-3 and R2-4, and the case that the memory device 150 uses the fifth and sixth soft read voltages R2-5 and R2-6. In the graphs of FIG. 10A, a shaded threshold voltage section may include memory cells whose reliabilities are weak, and soft data bits corresponding to the memory cells in the corresponding section may each have a value of '1'. On the other hand, an unshaded threshold voltage section may include memory cells whose reliabilities are strong, and soft data bits corresponding to the memory cells in the corresponding section may each have a value of '0'.

Referring to the graphs of FIG. 10A, even soft data generated by using any soft read voltages may include a symbol '0' and a symbol '1'. The major symbol may be '0', and the minor symbol may be '1'. However, depending on soft read voltages through which the soft data have been generated, the ratio of the major symbol (e.g., the symbol of the value '0') in the soft data may be changed. For example, the ratio of the major symbol in the soft data generated through the first and second soft read voltages R2-1 and R2-2 may be the highest, and the ratio of the major symbol in the soft data generated through the fifth and sixth soft read voltages R2-5 and R2-6 may be the lowest.

Depending on the ratio of the major symbol in the soft data, the probability that the major-symbol repetitions of a predetermined length or longer may be changed. Although the memory device 150 compresses soft data by using the same compression table, the compression ratio of the soft data may be changed depending on the probability of the major-symbol repetitions of the predetermined length or longer in the soft data. For example, when the memory device 150 compresses the soft data by using the first compression table 500 illustrated in FIG. 5, the probability of the major-symbol repetitions of a length of 16 or longer may decrease as the ratio of the major symbol in the soft data decreases. Therefore, as the ratio of the major symbol in the soft data decreases, the number of alphabets which can be compressed into a single bit compressed data may decrease thereby lowering the compression ratio of the soft data.

In accordance with the present embodiment, the memory device 150 may compress the soft data by using different compression tables depending on the ratio of the major symbol in the soft data.

FIG. 10B illustrates a second compression table 1000.

The second compression table 1000 may include a plurality of source alphabets and a plurality of code alphabets corresponding to the source alphabets.

FIG. 10B exemplifies nine source alphabets of '1', '01', '001', . . . , and '00000000'. Each of the source alphabets may not be the prefix of another source alphabet.

Similarly to those described with reference to FIG. 5, code alphabets corresponding to the source alphabet having the highest occurrence probability among the plurality of source alphabets may have the smallest length among the plurality of code alphabets. For example, a source alphabet as the major-symbol repetitions of the maximum length '$k_{max}$', namely '00000000' among the plurality of alphabets may have the highest occurrence probability. The code alphabet corresponding to the source alphabet '00000000' may be '0' and predetermined to have a length of only one bit. On the other hand, the code alphabets corresponding to the eight source alphabets other than '00000000' among the source alphabets may be predetermined to have a length of four bits. The first digit of each of the 4-bit code alphabets may be '1', and the other digits thereof may be randomly set to different values for each of the source alphabets. Each of the code alphabets may not be the prefix of another code alphabet.

As the ratio of the major symbol in the soft data is lower, the compression ratio in the case that the soft data is compressed by using the second compression table 1000 may be higher than that in the case that the soft data is compressed by using the first compression table 500.

FIG. 10C illustrates soft data and compressed data. Specifically, the soft data of FIGS. 10A to 10C may be equal to the soft data illustrated in FIG. 6. The compressed data of FIG. 10C may be compressed data which is generated by compressing the soft data based on the second compression table 1000.

The memory device 150 may divide soft data '00000 00000 00000 00010 00000 00000 00000 00001 00001 00001' into eight source alphabets '00000 000', '00 00000 0', '001', '0 00000 00', '000 00000', '00001', '00001' and '00001'. The memory device 150 may encode the eight source alphabets into eight code alphabets '0', '0', '1010', '0', '0', '1100', '1100' and '1100' by referring to the second compression table 1000. In the example of FIG. 10C, the 50-bit soft data may be expressed as the 20-bit compressed data. That is, although the same soft data is compressed, the compression ratio of the soft data may be changed depending on which compression table is selected to compress the soft data.

The first and second compression tables 500 and 1000 may be generalized as a first-type compression table. The first-type compression table may include a source alphabet as the major-symbol repetitions (e.g., the 0-bit repetitions) of the maximum length of 'n' (='$k_{max}$'=$2^{m-1}$), where 'n' and 'm' are natural numbers. The occurrence probability of the source alphabet configured only by the major symbol may be the highest, and the source alphabet may be referred to as a major source alphabet. The major source alphabet may correspond to a code alphabet '0'.

The first-type compression table may further include source alphabets as the major-symbol repetitions of the shorter length than 'n' and ending with a minor symbol. The alphabets other than the major source alphabet among the source alphabets included in the compression table may be referred to as minor source alphabets. The minor source alphabets may have a length of 'm' and correspond to code alphabets that start with a digit of '1'. The first and second compression tables 500 and 1000 may be special cases of the first-type compression table. Specifically, the first and second compression tables 500 and 1000 may be a compression table corresponding to (n=16) and a compression table corresponding to (n=8), respectively.

The memory device 150 may store a plurality of first-type compression tables corresponding to different n values. When the memory device 150 uses the compression tables corresponding to different n values in order to compress the same soft data, the compression ratio of the soft data may be changed. As the ratio of the major symbol in the soft data is low, the memory device 150 may compress the soft data by using a compression table which corresponds to a smaller n value, among the first-type compression tables.

For example, when compressing the soft data generated by using the fifth and sixth soft read voltages R2-5 and R2-6 in the example of FIG. 10A, the memory device 150 may use the compression table corresponding to the smaller n value than when compressing the soft data generated by using the first and second soft read voltages R2-1 to R2-2.

The ratio of the major symbol in the soft data may be changed depending on soft read voltages through which the memory device 150 generates the soft data. However, the ratio of the major symbol in the soft data may be changed due to another factor. For example, the ratio of the major symbol '0' in the soft data may be changed depending on the bit error rates of the memory cells. For example, as the bit error rates of the memory cells are high, the ratio of symbols '0' in the soft data may decrease, the symbols '0' indicating that the reliability is strong.

The memory device 150 may select any one of the plurality of compression tables based on the soft data generation method information, the soft read voltage information and the error rate information, which are received from the controller 130, and compress the soft data using the selected compression table.

For example, when generating soft data through the first-type soft data generation method described with reference to FIG. 10A, the memory device 150 may select any one of the first-type compression tables having various n values. The n values of the first-type compression tables may be selected based on the soft read voltage information and the error rate information.

A first example of the error rate information may be information on the number of error bits which are detected according to a result obtained by performing error correction decoding on read data previously by the controller 130. A second example of the error rate information may include length information of compressed data which are previously received by the controller 130. Since the soft data generated through the same method may have the same length, the memory device 150 may estimate the compression ratios of the soft data according to the lengths of the compression data. When the length of the compressed data is equal to or more than a threshold value, the memory device 150 may determine that the soft data are not sufficiently compressed, and select a compression table different from the currently selected compression table. The controller 130 may provide the memory device 150 with the error rate information of at least a part of the error rate information of the first example and the error rate information of the second example.

Figure 11A:
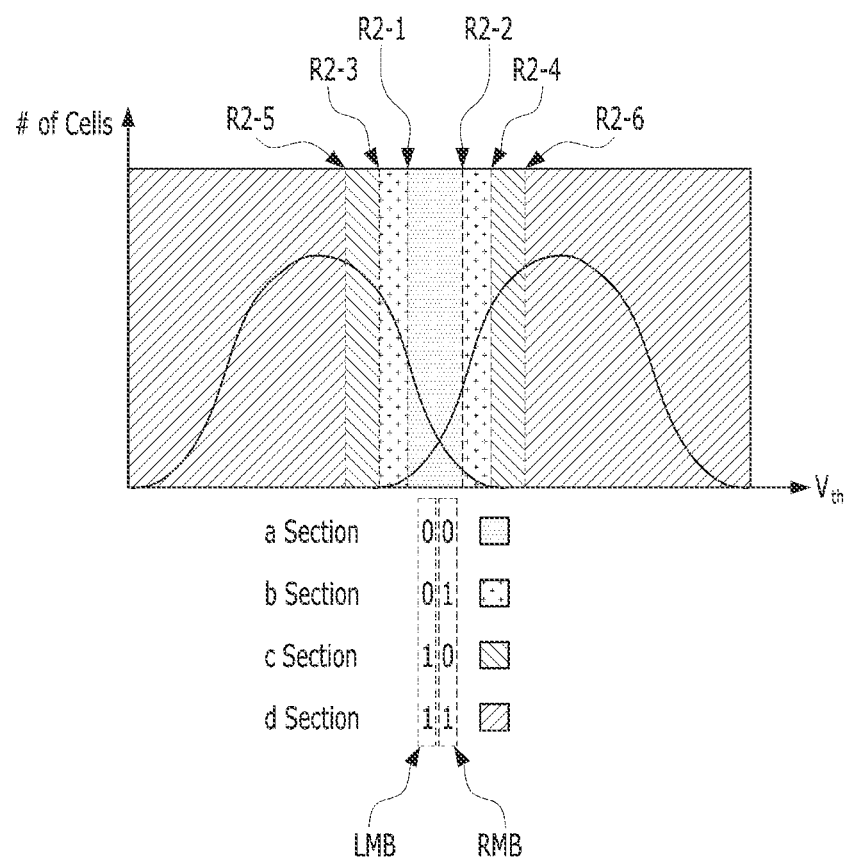

FIGS. 11A to 11C are diagrams for describing a second soft data generation method and a second-type compression table.

FIG. 11A is a diagram for describing the second soft data generation method.

FIG. 11A illustrates the threshold voltage distributions of the memory cells. When the memory device 150 acquires six soft read values using six soft read voltages R2-1 to R2-6, the threshold voltage sections of the memory cells may be divided into four sections according to operation results of the six soft read values.

The differences between the threshold voltages of the memory cells and the hard read voltage R2 may determine the reliabilities of the memory cells. According to which section a memory cell belongs to among the four threshold voltage sections, the memory device 150 may determine the reliability of the corresponding cell as any one of '00', '01', '10' and '11'. That is, the reliability of one memory cell may be determined as 2-bit data. In FIG. 11A, the left bit of the 2-bit data is represented by LMB (Left-Most Bit), and the right bit thereof is represented by RMB (Right-Most Bit).

As a threshold voltage section is remote from the hard read voltage V2, the reliabilities of memory cells belonging to the corresponding threshold voltage section may increase. In FIG. 11A, the reliabilities may be given in order of '00', '01', '10' and '11' from the threshold voltage section with the lowest reliability to the threshold voltage section with the highest reliability.

The memory device 150 may generate soft data based on the reliability information of memory cells which are soft read operation targets. The method in which the memory device 150 generates soft data indicating the reliability of each of the memory cells as multi-bit binary data, based on a plurality of soft read values which are read by using plural pairs of soft read voltages, may be referred to as a second soft data generation method.

FIG. 11A shows that the number of memory cells having a reliability of '11' among the plurality of memory cells may be the highest. Second soft data generated by the second soft data generation method may include '0' or '1' bits, and the ratio of '0' bit in the second soft data may be higher than the ratio of '1' bit therein. That is, the major symbol of the second soft data may be a symbol having a value of 1, and the minor symbol of the second soft data may be a symbol having a value of '0'.

The second soft data may include LMB data and RMB data. For example, when the reliabilities of certain memory cells are '00', '01', '10' and '11', respectively, the LMB data of the second soft data of the memory cells may be '0, 0, 1, 1', and the RMB data thereof may be '0, 1, 0, 1'. In the LMB data and the RMB data, the symbol having a value of '1' may be the major symbol. However, the ratio of the major symbol in the LMB data may be different from the ratio of the major symbol in the RMB data. In accordance with the present embodiment, the memory device 150 may compress the LMB data and the RMB data using different compression tables depending on the ratios of the major symbol in the LMB data and the RMB data.

FIG. 11A illustrates the case in which the soft data includes 2-bit reliability information per memory cell, but the present embodiment is not limited thereto. For example, the memory device 150 may generate soft data including 3 or more-bit reliability information per memory cell, divide the soft data by the number of digits of the reliability information, and compress the data, divided by the number of digits, using different compression tables.

The different compression tables for compressing the second soft data will be described with reference to FIGS. 11B and 11C.

FIG. 11B illustrates a third compression table 1100.

The third compression table 1100 is a first example of the second-type compression table. The third compression table 1100 may include a plurality of source alphabets each including one or more of the major symbol '1' and the minor symbol '0'. FIG. 11B exemplifies 17 source alphabets of '0', '10', '110', . . . and '1111111111111111'. Each of the source alphabets may not be the prefix of another source alphabet. The third compression table 1100 may include source alphabets and code alphabets, which are similar to those of the first compression table 500, except that the major symbol is changed to '1' and the minor symbol is changed to '0'. For example, a code alphabet corresponding to a major source alphabet '1111111111111111' among the plurality of source alphabets may be predetermined as '0'. On the other hand, the code alphabets corresponding to the minor source alphabets among the source alphabets may each have a length of five bits, and the first digits thereof may be '1'.

FIG. 11C illustrates a fourth compression table 1150.

The fourth compression table 1150 is a second example of the second-type compression table. The fourth compression table 1150 exemplifies nine source alphabets of '0', '10', '110', . . . , and '11111111'. Each of the source alphabets may not be the prefix of another source alphabet.

A code alphabet corresponding to a major source alphabet '11111111' among the plurality of source alphabets may be predetermined as '0'. Furthermore, the code alphabets corresponding to the minor source alphabets among the plurality of source alphabets may each have a length of four bits, and the first digits thereof may be '1'.

The memory device 150 may store a plurality of second-type compression tables corresponding to different n values, like the plurality of first-type compression tables. The memory device 150 may separately compress the LMB data and the RMB data using the second-type compression tables corresponding to different n values, according to the ratio of symbols '1' in each of the LMB data and the RMB data. For example, the memory device 150 may compress the second soft data by compressing the LMB data using the third compression table 1100, and compressing the RMB data using the fourth compression table 1150.

Figure 12A:
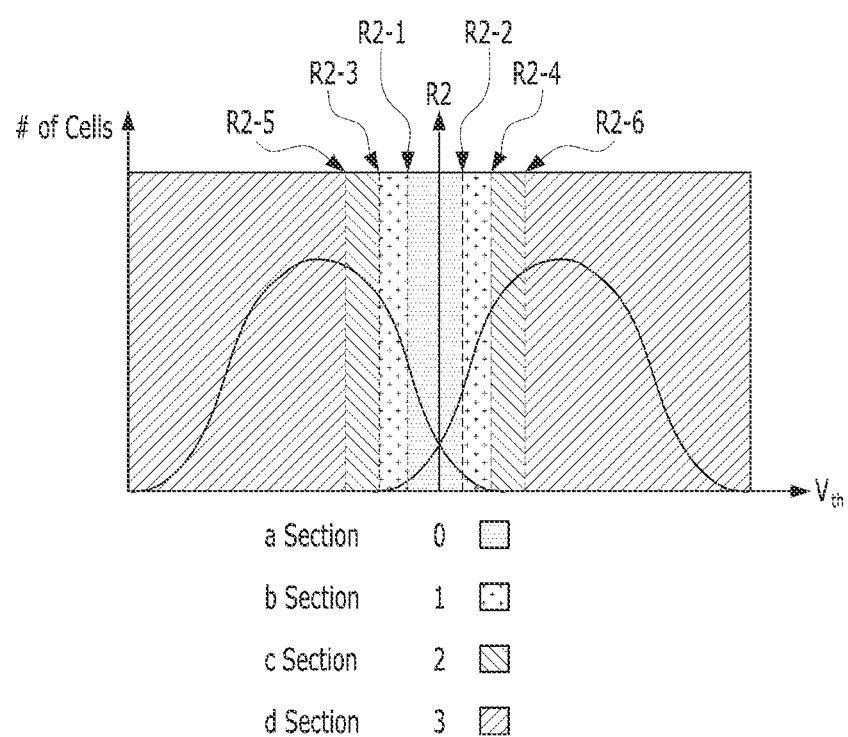

FIGS. 12A and 12B are diagrams for describing a third soft data generation method and a third-type compression table.

FIG. 12A is a diagram for describing the third soft data generation method.

FIG. 12A illustrates the threshold voltage distributions of memory cells. The threshold voltage distributions illustrated in FIG. 12A may be the same as the threshold voltage distributions illustrated in FIG. 11A. The memory device 150 may acquire six soft read values using six soft read voltages R2-1 to R2-6, and determine the reliabilities of the memory cells as any one of '0', '1', '2' and '3' according to a computation result of the six soft read values.

As a threshold voltage section is remote from the hard read voltage V2, the reliabilities of memory cells belonging to the corresponding threshold voltage section may become higher. In FIG. 12A, '0', '1', '2' and '3' may indicate reliabilities which are sequentially strong.

The memory device 150 may generate soft data using the reliabilities of memory cells, which are soft read operation targets, as symbols. The method in which the memory device 150 generates soft data indicating the reliability of each of the memory cells as non-binary data, based on a plurality of soft read values which are read by using plural pairs of soft read voltages, may be referred to as a third soft data generation method.

The values of the symbols of third soft data generated through the third soft data generation method may be any one of '0', '1', '2' and '3'. FIG. 12A shows that the number of memory cells having a reliability of '3' among the plurality of memory cells may be the highest. Therefore, the major symbol of the third soft data may be '3', and the minor symbols thereof may be '0', '1' and '2'.

The third-type compression table for compressing the third soft data will be described with reference to FIG. 12B.

FIG. 12B illustrates a fifth compression table 1200.

The fifth compression table 1200 is a first example of the third-type compression table. The third-type compression table may include a plurality of source alphabets each including one or more of the major symbol '3' and the minor symbols '0', '1' and '2'. Each of the source alphabets may not be the prefix of another source alphabet.

The fifth compression table 1200 may include code alphabets corresponding to the source alphabets. For example, a code alphabet corresponding to '33333', which has the highest occurrence probability among the plurality of source alphabets, may have a value of '0'.

The third-type compression table may include a major source alphabet as the major-symbol repetitions (e.g., 3-bit repetitions) of the maximum length 'n', the major symbol having a value of '3'. A source alphabet as the major-symbol repetitions (e.g., 3-bit repetitions) of the maximum length 'n' may correspond to a major source alphabet. The major source alphabet may correspond to a code alphabet '0'.

The third-type compression table may further include a minor source alphabet as the major-symbol repetitions of a shorter length than 'n' and ending with a minor symbol. The minor source alphabets may have a length of 'k' and correspond to code alphabets that start with a digit of '1'.

Here, a maximum length 'm' of the code alphabet may be determined based on the total number of minor source alphabets. The total number of the minor source alphabets may be determined according to the number of the minor symbols and the maximum length 'n' of the source alphabets. For example, when the third soft data has four number of symbols (i.e., a single major symbol and 3 number of minor symbols) and the maximum length of the source alphabets is 'n', the number of the minor source alphabets may be '3n' and 'm' may be selected as the minimum value among natural numbers which satisfy $3n \leq 2^{m-1}$.

The memory device 150 may store a plurality of third-type compression tables corresponding to different 'n' values. The memory device 150 may compress the third soft data by referring to any one of the plurality of third-type compression tables according to the ratio of the major symbol in the third soft data.

Figure 13:
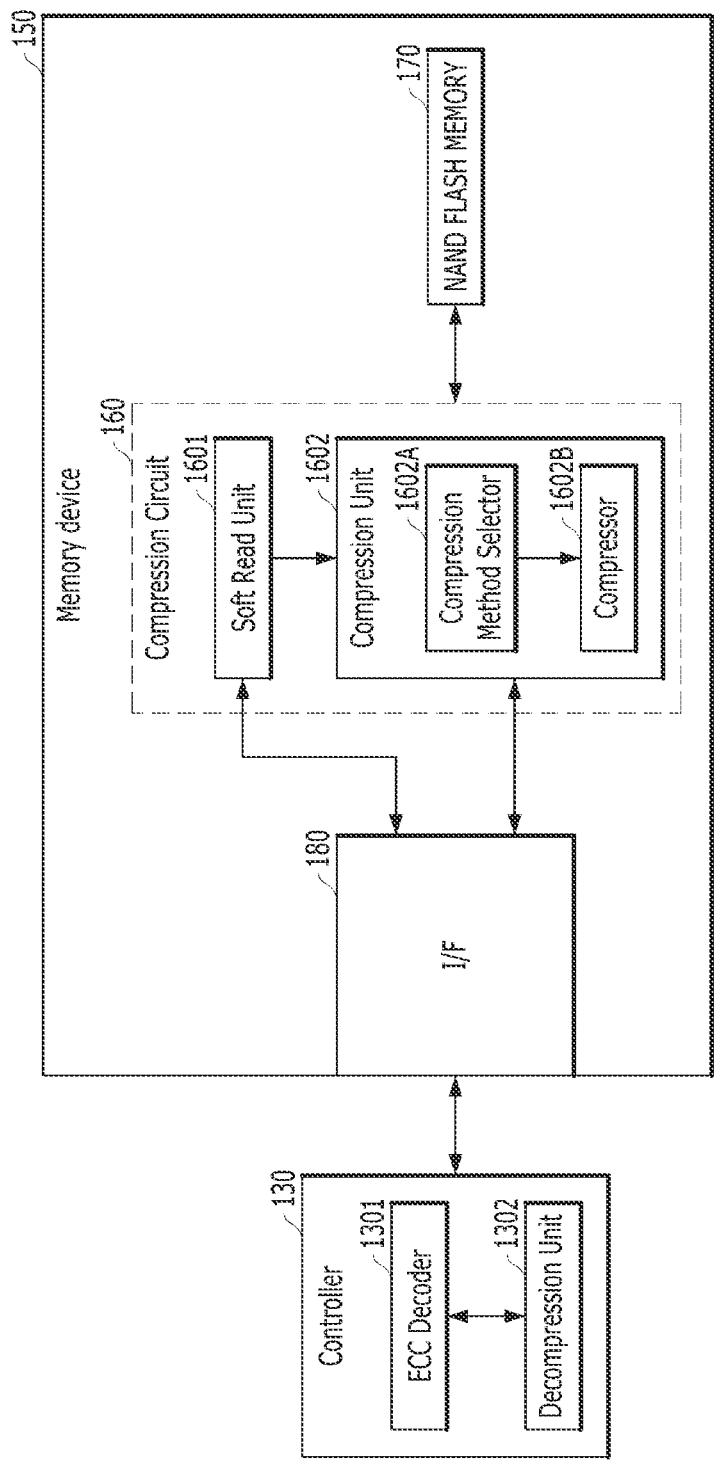
FIG. 13 illustrates a memory system in accordance with an embodiment.

FIG. 13 illustrates a memory system 110 in accordance with an embodiment.

Referring to FIG. 13, the memory system 110 may include a memory device 150 and a controller 130. The memory device 150 and the controller 130 of FIG. 13 may correspond to the memory device 150 and the controller 130, respectively, which have been described with reference to FIGS. 1 and 2.

The controller 130 may include an ECC decoder 1301 and a decompression unit 1302.

The ECC decoder 1301 may provide the memory device 150 with a soft read command, soft read voltage information and error rate information, in order to acquire compressed soft data, i.e., compressed data, from the memory device

150. The soft read command may include soft data generation method information. The soft read voltage information may indicate information on soft read voltages which are used to perform a soft read operation in response to the soft read command.

The decompression unit 1302 will be described below in detail.

The memory device 150 may include a compression circuit 160, a NAND flash memory 170 and an I/F 180.

The NAND flash memory 170 may store data in a memory cell array composed of memory cell transistors. The NAND flash memory 170 may have a hierarchical structure of memory dies, planes, memory blocks and pages. One memory die may receive one command at a time. The flash memory may include a plurality of memory dies. One memory die may include a plurality of planes, and the plurality of planes may process commands, received by the memory die, in parallel. Each of the planes may include a plurality of memory blocks. The memory block may be the minimum unit of an erase operation. One memory block may include a plurality of pages. The page may be the minimum unit of a write operation.

The compression circuit 160 may include a soft read unit 1601 and a compression unit 1602. The soft read unit 1601 may be referred to soft read logic, and compression unit 1602 may be referred to as a compressor.

The soft read unit 1601 may receive the soft read command and the soft read voltage information from the controller 130. The soft read unit 1601 may determine a soft data generation method based on the soft read command, and control the NAND flash memory 170 to apply soft read voltages based on the soft data generation method and the soft read voltage information. The soft read unit 1601 (e.g., soft read logic) may generate soft data according to the soft data generation method included in the soft read command. Examples of various soft data generation methods which may be used by the soft read unit 1601 have been described in detail with reference to FIGS. 10A, 11A and 12A.

The compression unit 1602 may generate compressed data by compressing the soft data generated by the soft read unit 1601. The compression unit 1602 may include a compression method selector 1602A and a compressor 1602B.

The compression method selector 1602A may select a compression table which is to be used to compress the soft data generated by the soft read unit 1601, among the plurality of compression tables stored in the memory device 150. The compression method selector 1602A may select the compression table based on the soft read command, the soft read voltage information and the error rate information, which are received from the controller 130. Examples of various compression tables which may be selected by the compression method selector 1602A have been described in detail with reference to FIGS. 5, 10B, 11B, 11C and 12B.

The compressor 1602B may generate the compressed data by compressing the soft data generated by the soft read unit 1601, using the compression table selected by the compression method selector 1602A. Examples of the method for generating compressed data have been described in detail with reference to FIGS. 5, 6 and 9. For example, the compressor 1602B may generate the compressed data by adding end data to the soft data generated by the soft read unit 1601, and compressing the data to which the end data is added.

The I/F 180 may provide the controller 130 with the compressed data generated by the compressor 1602B.

The decompression unit 1302 of the controller 130 may generate decompressed data by decompressing the compressed data received from the memory device 150 using the decompression table. Examples of the method for generating decompressed data by decompressing compressed data have been described in detail with reference to FIGS. 7 and 8.

The decompression unit 1302 may decompress the compressed data using the decompression table including the same source alphabets and code alphabets as those of the compression table which has been used to generate the compressed data. The I/F 180 may transfer, from the compression unit 1602 to the controller 130, the information of the compression table selected by the compression method selector 1602A. The decompression unit 1302 may decompress the compressed data using the decompression table according to the transferred information of the compression table selected by the compression method selector 1602A. For example, when the compressor 1602B compresses soft data using the first compression table 500 of FIG. 5, the decompression unit 1302 may decompress the compressed data using the decompression table 700 of FIG. 7.

In an implementation, the decompression unit 1302 may select a decompression table corresponding to the compression table based on the soft data generation method, the soft read voltage information and the error rate information, which have been used to generate the soft data, or select a decompression table based on the data pattern of the compressed data, and decompress the data using the selected decompression table.

In an implementation, when the decompressed data reaches a predetermined length, the decompression unit 1302 may determine whether the compressed data was normally received from the memory device 150, according to whether the last part of the decompressed data includes end data.

When determining that the compressed data was not normally received, the decompression unit 1302 may request the memory device 150 to retransmit the compressed data. The memory device 150 may provide the existing compressed data to the memory device 150 again in response to the retransmission request, or generate new soft data and compressed data, and provide the generated compressed data to the memory device 150. When determining that the compressed data was normally received, the decompression unit 1302 may provide the decompressed data to the ECC decoder 1301. The ECC decoder 1301 may perform soft decision decoding using the decompressed data as soft data.

Figure 14:
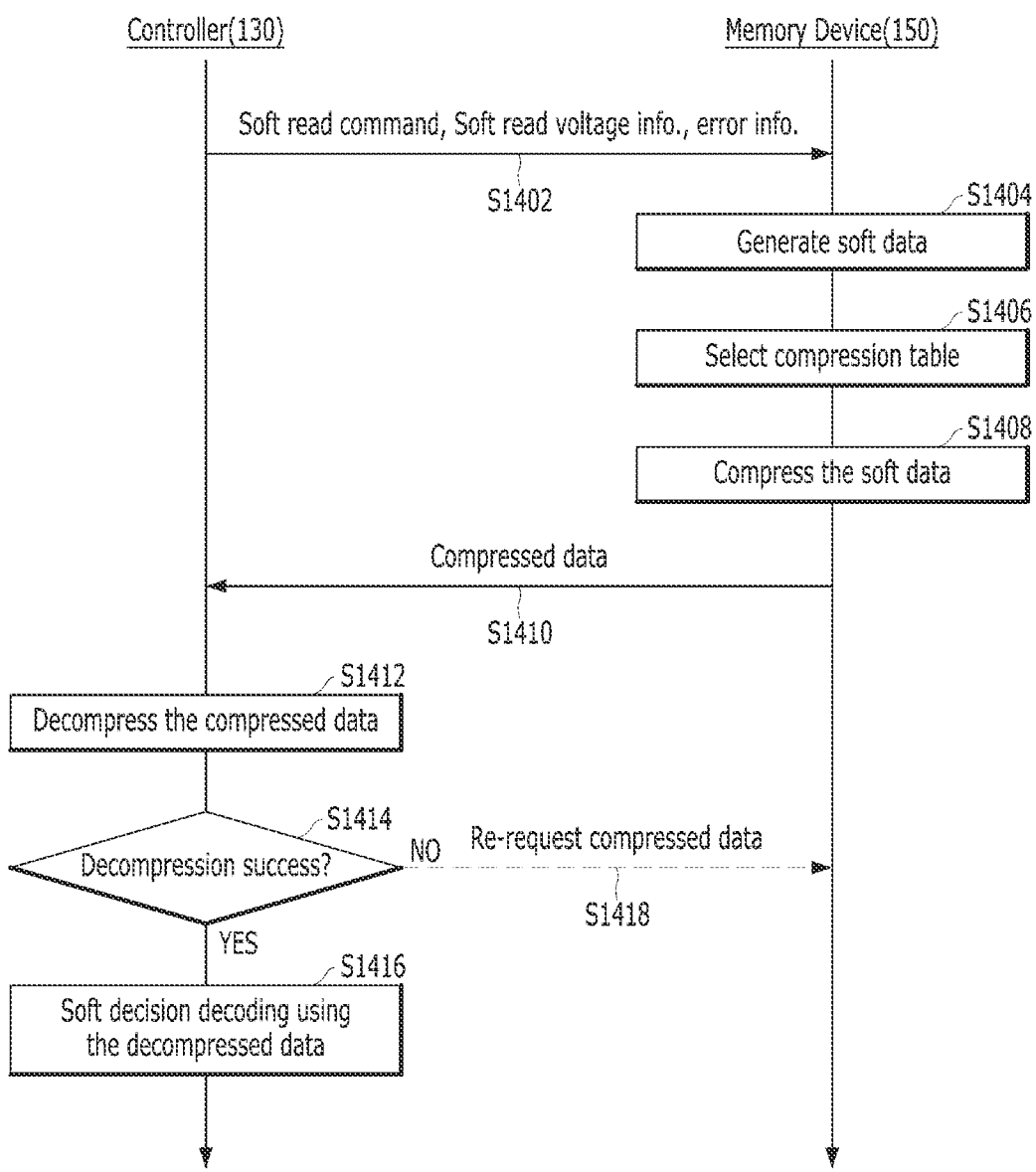
FIG. 14 is a flowchart schematically illustrating an operation of a memory system in accordance with an embodiment.

FIG. 14 is a flowchart schematically illustrating an operation of the memory system 110 in accordance with the present embodiment.

In step S1402, the controller 130 may request compressed soft data, i.e., compressed data, from the memory device 150. The controller 130 may provide the memory device 150 with soft read data, soft read voltage information and error rate information, in order to request the compressed data.

In step S1404, the memory device 150 may generate soft data by performing a soft read operation in response to the soft read command from the controller 130.

The memory device 150 may generate soft data through a method selected among the various methods described with reference to FIGS. 10A, 11A and 12A. For example, the memory device 150 may determine through which method the memory device 150 is to generate soft data based on the soft read command from the controller 130. In order to generate the soft data, the memory device 150 may apply soft read voltages to the NAND flash memory 170 according to the soft read voltage information from the controller 130.

In step S1406, the memory device 150 may select any one compression table among the plurality of compression tables, in order to compress the soft data.

The compression table may be predetermined and stored in the memory device 150. The compression table may include a plurality of source alphabets constituting the soft data and a plurality of code alphabets corresponding to the source alphabets. Each of the source alphabets may not correspond to the prefix of another source alphabet, and each of the code alphabets may not correspond to the prefix of another code alphabet.

Each of the source alphabets may include one or more of a major symbol and a minor symbol. The plurality of source alphabets may include a major source alphabet and minor source alphabets other than the major source alphabet.

The major source alphabet may be configured by the major-symbol repetitions of the maximum length 'n' as exemplified in the first to fifth compression tables 500, 1000, 1100, 1150 and 1200, and have the largest length among the plurality of source alphabets. The code alphabet corresponding to the major source alphabet may have the smallest length among the plurality of code alphabets. For example, the code alphabet may include only bits '0'.

The minor source alphabet may be configured by the major-symbol repetitions of a shorter length than 'n' and ending with a single minor symbol. The code alphabet corresponding to the minor source alphabet may have an m-bit length. For example, the code alphabet may start with a bit of '1'. When the number of minor symbols is represented by 's', 'n' and 'm' may be natural numbers which have a relationship of $s \times n \leq 2^{m-1}$.

The memory device 150 may include various types of compression tables according to the soft data generation method. Each of the compression tables may include a plurality of compression tables corresponding to different n values.

The memory device 150 may select the compression table based on the soft data generation method, the soft read voltage information and the error rate information, which are received from the controller 130.

In step S1408, the memory device 150 may compress the soft data using the selected compression table.

For example, the memory device 150 may divide the soft data into a plurality of source alphabets by referring to the compression table. The memory device 150 may encode the plurality of source alphabets into code alphabets, and generate compressed data based on the plurality of code alphabets.

The memory device 150 may encode the major source alphabet, which has the largest length among the source alphabets and is most likely to occur in the soft data, into the shortest code alphabet, thereby improving the compression ratio of the soft data.

In an implementation, the memory device 150 may add end data to the soft data, and generate compressed data based on the soft data to which the end data is added, in order to compress all symbols of the soft data.

In step S1410, the memory device 150 may provide the compressed data to the controller 130.

In step S1412, the controller 130 may generate decompressed data by decompressing the compressed data.

For example, the controller 130 may use a decompression table corresponding to the compression table selected in step S1406, in order to generate the decompressed data. The controller 130 may select the decompression table based on the soft read command, the soft read voltage information and the error rate information, which are provided to the memory device 150, or select the decompression table based on the data pattern of the compressed data.

In step S1414, the controller 130 may determine whether the decompressed data is normal compressed data.

For example, the controller 130 may receive the compressed data, generated based on the soft data to which the end data is added, from the memory device 150. When the compressed data is normally received, the decompressed data may have the data format of the soft data to which the end data is added.

In order to determine whether the decompressed data is normal data, the controller 130 may determine whether the decompressed data is data having a predetermined length, and the last bit thereof corresponds to the end data.

When the decompressed data is normal data (YES in step S1414), the controller 130 may perform soft decision decoding using the decompressed data in step S1416.

When the decompressed data is not normal data (NO in step S1414), the controller 130 may re-request the compressed data from the memory device 150 in step S1418.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, modules, managers, units, compressors, decompressors, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Although various embodiments have been described for illustrative purposes, it will be apparent to those skilled in the art that various changes and modifications may be made without departing from the spirit and scope of the invention as defined in the following claims. The embodiments may be combined to form additional embodiments.

What is claimed is:

1. A memory device comprising:
   a plurality of memory cells;
   soft read logic configured to generate soft data by reading data from the plurality of memory cells in response to a soft read command from a controller, the soft data including at least a major symbol and at least a minor symbol;
   a compressor configured to generate compressed data by:

encoding, into a code alphabet having a second length, a major source alphabet including repetitions of the major symbol by a first length among a plurality of source alphabets included in the soft data, and encoding, into a code alphabet having a longer length than the second length, a minor source alphabet including repetitions of the major symbol by a shorter length than the first length and ending with one minor symbol; and an interface configured to provide the compressed data to the controller.

2. The memory device of claim 1, wherein the compression unit generates the compressed data based on a selected one among one or more compression tables, each indicating relationships between the major and minor source alphabets and the corresponding code alphabets.

3. The memory device of claim 2, further comprising a compression method selector configured to store the compression tables and selecting one among the compression tables according to a value of the major symbol, a value of the minor symbol and a value of the first length.

4. The memory device of claim 3,
wherein the compression method selector selects the compression table having a particular value of the first length based on error rate information, and
wherein the error rate information includes at least any one of length information of previously compressed data and information on a number of error bits detected from data decompressed from the previously compressed data.

5. The memory device of claim 4, wherein the compression method selector selects the compression table having the particular value of the first length further based on a soft read voltage, through which the data is read from the memory cells.

6. The memory device of claim 3, wherein the compression method selector selects the compression table having a particular value of the major symbol and a particular value of the minor symbol based on a number of the major symbol and the minor symbol and the value of the major symbol and the minor symbol included in the soft data.

7. The memory device of claim 6,
wherein the soft data is multi-bit soft data including multi-bit reliability information per memory cell,
wherein the compressor is further configured to drive the soft data into even-bit data and odd-bit data,
wherein the compression method selector selects the compression table for each of the even-bit data and the odd-bit data further based on error rate information of each of the even-bit data and the odd-bit data,
wherein the compressor generates compressed data for each of the even-bit data and the odd-bit data, and
wherein the error rate information for each of the even-bit data and the odd-bit data includes at least any one of length information of previously compressed data for corresponding one of the even-bit data and the odd-bit data, and information on a number of error bits detected from data decompressed from the previously compressed data.

8. The memory device of claim 6,
wherein the soft data is non-binary soft data including non-binary reliability information per memory cell,
wherein the compression method selector selects the compression table further based on error rate information and a number of symbols for indicating the non-binary reliability information, and
wherein the error rate information includes at least any one of length information of previously compressed data and information on a number of error bits detected from data decompressed from the previously compressed data.

9. The memory device of claim 1,
wherein the code alphabet having the second length is not a prefix of the code alphabet having the longer length than the second length, and
wherein the code alphabets encoded from different minor source alphabets have different values.

10. The memory device of claim 9,
wherein the code alphabet having the second length is '0', and
wherein the first digit of the code alphabet having the longer length than the second length is '1'.

11. The memory device of claim 10,
wherein the compressor generates the compressed data based on a selected one among one or more compression tables, each indicating relationships between the major and minor source alphabets and the corresponding code alphabets,
wherein, in each of the compression tables, a total number of the minor source alphabets depends on the first length,
wherein a length of the code alphabet having a longer length than the second length depends on the total number of the minor source alphabets.

12. The memory device of claim 1,
wherein the major symbol is the most likely to occur in the soft data, and
wherein the minor symbol is a symbol other than the major symbol.

13. The memory device of claim 12, wherein the major symbol is a symbol, of which reliability is stronger than the minor symbol.

14. The memory device of claim 1, wherein the compressor generates the compressed data further by:
adding end data to an end of the soft data, and
encoding, as the minor source alphabet, a chunk configured by the end data and remaining symbols, which are successive to the end data and do not belong to the major source alphabet or the minor source alphabet in the soft data.

15. The memory device of claim 14, wherein the end data is the minor symbol.

16. The memory device of claim 1, wherein the compressor is further configured to detect the major source alphabet and the minor source alphabet from the soft data by instantaneously checking symbols within the soft data.

17. A memory system comprising:
a memory device; and
a controller configured to provide a soft read command and error rate information to the memory device,
wherein the memory device includes
logic configured to generate soft data including at least a major symbol and at least a minor symbol in response to the soft read command,
a selector configured to select, based on the soft read command and the error rate information, any one of a plurality of compression tables each indicating relationships between source alphabets and corresponding code alphabets,
a compressor configured to generate compressed data by encoding the source alphabets detected from the soft data into the corresponding code alphabets according to the selected compression table, and
provide the compressed data to the controller, wherein a source alphabet is not a prefix of another source alphabet within each of the plurality of compression tables, wherein a major source alphabet is the most likely to occur and has the longest length among the source alphabets within each of the plurality of compression tables, and wherein the code alphabet corresponding to the major source alphabet has the smallest length among the code alphabets within each of the plurality of compression tables.

18. The memory system of claim 17, wherein the controller is further configured to:

generate decompressed data by decompressing the compressed data according to a decompression table corresponding to the selected compression table, and perform soft decision decoding on the decompressed data.

19. The memory system of claim 17, wherein the compressor generates the compressed data further by:

adding end data to an end of the soft data, and encoding, as one of the source alphabets detected from the soft data, a chunk configured by the end data and remaining data, which are successive to the end data and do not belong to the source alphabets in the soft data.

20. The memory system of claim 19, wherein the controller is further configured to:

generate decompressed data by decompressing the compressed data, and perform soft decision decoding on the decompressed data when the decompressed data has a predetermined length and has the end data at an end thereof, and wherein the predetermined length is a sum of a length of the soft data and a length of the end data.

21. The memory system of claim 20, wherein the controller is further configured to request, when the decompressed data does not have the predetermined length or does not have the end data at the end thereof, the compressed data from the memory device.

22. A data system comprising:

a memory device including a compressor configured to compress an original sequence including at least first and second symbols by referring to a table; and a controller including a decompressor configured to recover the original sequence from the compressed sequence by referring to the table, wherein the controller provides a soft read command and error rate information to the memory device, wherein the table includes original alphabets of different values and corresponding compressed alphabets of different values, the alphabets being defined according to a Huffman coding scheme, wherein each of the original alphabets of various lengths ends with one between the first and second symbols and a remaining part of the original alphabet is configured by repetitions of the first symbol, and wherein the compressed alphabet corresponding to the original alphabet ending with the first symbol is shorter than other compressed alphabets having the same length.

* * * * *